US009684174B2

(12) United States Patent
Fleck et al.

(10) Patent No.: US 9,684,174 B2
(45) Date of Patent: *Jun. 20, 2017

(54) IMAGING STRUCTURE WITH EMBEDDED LIGHT SOURCES

(71) Applicant: Microsoft Technology Licensing, LLC, Redmond, WA (US)

(72) Inventors: Rod G. Fleck, Bellevue, WA (US); David D. Bohn, Fort Collins, CO (US); Andreas G. Nowatzyk, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/171,924

(22) Filed: Jun. 2, 2016

(65) Prior Publication Data

US 2016/0282625 A1 Sep. 29, 2016

Related U.S. Application Data

(63) Continuation of application No. 13/397,516, filed on Feb. 15, 2012, now Pat. No. 9,368,546.

(51) Int. Cl.
*F21V 1/00* (2006.01)
*F21V 11/00* (2015.01)
(Continued)

(52) U.S. Cl.
CPC .......... *G02B 27/0172* (2013.01); *F21V 5/004* (2013.01); *F21V 5/007* (2013.01);
(Continued)

(58) Field of Classification Search
CPC ..... H01L 33/60; H01L 27/153; H01L 27/156; H01L 33/005; H01L 33/58; H01L 27/15;
(Continued)

(56) References Cited

U.S. PATENT DOCUMENTS 3,836,258 A 9/1974 Courten et al.
3,906,528 A 9/1975 Johnson
(Continued)

FOREIGN PATENT DOCUMENTS

CN 1440513 9/2003
CN 101029968 9/2007
(Continued)

OTHER PUBLICATIONS

"Examiner's Answer to Appeal Brief", U.S. Appl. No. 13/428,879, Oct. 12, 2016, 18 pages.
(Continued)

*Primary Examiner* — Andrew Coughlin
*Assistant Examiner* — Jessica M Apenteng

(57) ABSTRACT

In embodiments of an imaging structure with embedded light sources, an imaging structure includes a silicon backplane with a driver pad array. The embedded light sources are formed on the driver pad array in an emitter material layer, and the embedded light sources can be individually controlled at the driver pad array to generate and emit light. A conductive material layer over the embedded light sources forms a p-n junction between the emitter material layer and the conductive material layer. Micro lens optics can be positioned over the conductive material layer to direct the light that is emitted from the embedded light sources. Further, the micro lens optics may be implemented as parabolic optics to concentrate the light that is emitted from the embedded light sources.

20 Claims, 6 Drawing Sheets

(51) Int. Cl.

| | |
|---|---|
| *G02B 27/01* | (2006.01) |
| *H01L 33/60* | (2010.01) |
| *F21V 5/00* | (2015.01) |
| *H01L 33/00* | (2010.01) |
| *H01L 33/58* | (2010.01) |
| *H01S 5/40* | (2006.01) |
| *H01L 27/15* | (2006.01) |
| *F21Y 103/00* | (2016.01) |
| *F21Y 105/00* | (2016.01) |

(52) U.S. Cl.
CPC .......... *H01L 27/153* (2013.01); *H01L 27/156* (2013.01); *H01L 33/005* (2013.01); *H01L 33/58* (2013.01); *H01L 33/60* (2013.01); *H01S 5/4025* (2013.01); *F21Y 2103/003* (2013.01); *F21Y 2105/001* (2013.01); *G02B 2027/0112* (2013.01); *G02B 2027/0178* (2013.01); *H01L 27/15* (2013.01); *H01L 2933/0058* (2013.01)

(58) Field of Classification Search
CPC ........ F21V 5/004; F21V 5/007; H01S 5/4025; F21Y 2103/003; F21Y 2105/001; G02B 2027/0112; G02B 2027/0178
USPC .................. 362/235, 249.02, 800, 249.01
See application file for complete search history.

(56) References Cited

U.S. PATENT DOCUMENTS

| | | |
|---|---|---|
| 3,971,065 A | 7/1976 | Bayer |
| 4,711,512 A | 12/1987 | Upatnieks |
| 5,019,808 A | 5/1991 | Prince et al. |
| 5,146,355 A | 9/1992 | Prince et al. |
| 5,252,950 A | 10/1993 | Saunders et al. |
| 5,309,169 A | 5/1994 | Lippert |
| 5,359,444 A | 10/1994 | Piosenka et al. |
| 5,453,877 A | 9/1995 | Gerbe et al. |
| 5,455,882 A | 10/1995 | Veligdan |
| 5,459,611 A | 10/1995 | Bohn et al. |
| 5,483,307 A | 1/1996 | Anderson |
| 5,491,580 A | 2/1996 | O'Meara |
| 5,543,588 A | 8/1996 | Bisset et al. |
| 5,574,473 A | 11/1996 | Sekiguchi |
| 5,583,609 A | 12/1996 | Mizutani et al. |
| 5,606,455 A | 2/1997 | Eichenlaub |
| 5,614,941 A | 3/1997 | Hines |
| 5,648,643 A | 7/1997 | Knowles et al. |
| 5,673,146 A | 9/1997 | Kelly |
| 5,708,449 A | 1/1998 | Heacock et al. |
| 5,714,967 A | 2/1998 | Okamura et al. |
| 5,751,476 A | 5/1998 | Matsui et al. |
| 5,771,320 A | 6/1998 | Stone |
| 5,856,842 A | 1/1999 | Tedesco |
| 5,886,822 A | 3/1999 | Spitzer |
| 5,940,149 A | 8/1999 | Vanderwerf |
| 5,959,664 A | 9/1999 | Woodgate |
| 5,982,553 A | 11/1999 | Bloom et al. |
| 5,991,087 A | 11/1999 | Rallison |
| 6,101,008 A | 8/2000 | Popovich |
| 6,144,439 A | 11/2000 | Carollo |
| 6,160,667 A | 12/2000 | Smoot |
| 6,188,427 B1 | 2/2001 | Anderson et al. |
| 6,271,808 B1 | 8/2001 | Corbin |
| 6,323,970 B1 | 11/2001 | Popovich |
| 6,377,401 B1 | 4/2002 | Bartlett |
| 6,466,198 B1 | 10/2002 | Feinstein |
| 6,481,851 B1 | 11/2002 | McNelley et al. |
| 6,496,218 B2 | 12/2002 | Takigawa et al. |
| 6,529,331 B2 | 3/2003 | Massof et al. |
| 6,542,307 B2 | 4/2003 | Gleckman et al. |
| 6,545,650 B1 | 4/2003 | Yamada et al. |
| 6,547,416 B2 | 4/2003 | Pashley et al. |
| 6,554,428 B2 | 4/2003 | Fergason et al. |
| 6,577,411 B1 | 6/2003 | David |
| 6,580,529 B1 | 6/2003 | Amitai et al. |
| 6,606,152 B2 | 8/2003 | Littau |
| 6,639,201 B2 | 10/2003 | Almogy et al. |
| 6,753,828 B2 | 6/2004 | Tuceryan et al. |
| 6,775,460 B2 | 8/2004 | Steiner et al. |
| 6,825,987 B2 | 11/2004 | Repetto et al. |
| 6,829,095 B2 | 12/2004 | Amitai |
| 6,867,753 B2 | 3/2005 | Chinthammit et al. |
| 6,888,613 B2 | 5/2005 | Robins et al. |
| 6,919,867 B2 | 7/2005 | Sauer |
| 6,947,020 B2 | 9/2005 | Kiser et al. |
| 6,964,731 B1 | 11/2005 | Krisko et al. |
| 6,992,738 B2 | 1/2006 | Ishihara et al. |
| 7,006,215 B2 | 2/2006 | Hoff et al. |
| 7,015,876 B1 | 3/2006 | Miller |
| 7,048,385 B2 | 5/2006 | Beeson et al. |
| 7,184,615 B2 | 2/2007 | Levola |
| 7,193,584 B2 | 3/2007 | Lee et al. |
| 7,250,930 B2 | 7/2007 | Hoffman et al. |
| 7,261,453 B2 | 8/2007 | Morejon et al. |
| 7,271,795 B2 | 9/2007 | Bradski |
| 7,359,420 B2 | 4/2008 | Shchegrov et al. |
| 7,365,734 B2 | 4/2008 | Fateh et al. |
| 7,369,101 B2 | 5/2008 | Sauer et al. |
| 7,396,133 B2 | 7/2008 | Burnett et al. |
| 7,417,617 B2 | 8/2008 | Eichenlaub |
| 7,418,170 B2 | 8/2008 | Mukawa et al. |
| 7,428,001 B2 | 9/2008 | Schowengerdt et al. |
| 7,430,349 B2 | 9/2008 | Jones |
| 7,430,355 B2 | 9/2008 | Heikenfeld et al. |
| 7,513,627 B2 | 4/2009 | Larson et al. |
| 7,515,143 B2 | 4/2009 | Keam et al. |
| 7,542,665 B2 | 6/2009 | Lei |
| 7,551,814 B1 | 6/2009 | Smits |
| 7,576,916 B2 | 8/2009 | Amitai |
| 7,607,111 B2 | 10/2009 | Vaananen et al. |
| 7,660,500 B2 | 2/2010 | Konttinen et al. |
| 7,679,641 B2 | 3/2010 | Lipton et al. |
| 7,719,769 B2 | 5/2010 | Sugihara et al. |
| 7,768,534 B2 | 8/2010 | Pentenrieder et al. |
| 7,777,944 B2 | 8/2010 | Ho et al. |
| 7,817,104 B2 | 10/2010 | Ryu et al. |
| 7,868,300 B2 | 1/2011 | Kruit et al. |
| 7,909,958 B2 | 3/2011 | Washburn et al. |
| 7,986,462 B2 | 7/2011 | Kobayashi et al. |
| 8,033,709 B2 | 10/2011 | Kao et al. |
| 8,125,579 B2 | 2/2012 | Khan et al. |
| 8,160,411 B2 | 4/2012 | Levola et al. |
| 8,195,220 B2 | 6/2012 | Kim et al. |
| 8,233,204 B1 | 7/2012 | Robbins et al. |
| 8,246,170 B2 | 8/2012 | Yamamoto et al. |
| 8,384,999 B1 | 2/2013 | Crosby et al. |
| 8,418,083 B1 | 4/2013 | Lundy et al. |
| 8,446,340 B2 | 5/2013 | Aharoni |
| 8,472,119 B1 | 6/2013 | Kelly |
| 8,576,143 B1 | 11/2013 | Kelly |
| 8,611,014 B2 | 12/2013 | Valera et al. |
| 8,629,815 B2 | 1/2014 | Brin et al. |
| 8,638,498 B2 | 1/2014 | Bohn et al. |
| 8,645,871 B2 | 2/2014 | Fong et al. |
| 8,666,212 B1 | 3/2014 | Amirparviz |
| 8,754,831 B2 | 6/2014 | Kollin et al. |
| 8,770,813 B2 | 7/2014 | Bohn et al. |
| 8,810,600 B2 | 8/2014 | Bohn et al. |
| 8,817,350 B1 | 8/2014 | Robbins et al. |
| 8,854,802 B2 | 10/2014 | Robinson et al. |
| 8,917,453 B2 | 12/2014 | Bohn |
| 8,941,683 B2 | 1/2015 | Son et al. |
| 8,989,535 B2 | 3/2015 | Robbins |
| 9,052,414 B2 | 6/2015 | Travis et al. |
| 9,223,138 B2 | 12/2015 | Bohn |
| 9,272,338 B2 | 3/2016 | Fujita et al. |
| 9,297,996 B2 | 3/2016 | Bohn et al. |
| 9,298,012 B2 | 3/2016 | Bohn et al. |
| 9,368,546 B2 | 6/2016 | Fleck et al. |
| 9,578,318 B2 | 2/2017 | Fleck et al. |
| 9,581,820 B2 | 2/2017 | Robbins |
| 2001/0043208 A1 | 11/2001 | Furness, III et al. |

(56) References Cited

U.S. PATENT DOCUMENTS

| | | |
|---|---|---|
| 2002/0015110 A1 | 2/2002 | Brown Elliott |
| 2002/0041735 A1 | 4/2002 | Cai et al. |
| 2002/0044152 A1 | 4/2002 | Abbott et al. |
| 2002/0044162 A1 | 4/2002 | Sawatari |
| 2002/0063820 A1 | 5/2002 | Broer et al. |
| 2002/0171939 A1 | 11/2002 | Song |
| 2002/0180659 A1 | 12/2002 | Takahashi |
| 2003/0006364 A1 | 1/2003 | Katzir et al. |
| 2003/0137706 A1 | 7/2003 | Rmanujam et al. |
| 2003/0179453 A1 | 9/2003 | Mori et al. |
| 2004/0012341 A1 | 1/2004 | Hyuga |
| 2004/0085649 A1 | 5/2004 | Repetto et al. |
| 2004/0108971 A1 | 6/2004 | Waldern et al. |
| 2004/0109234 A1 | 6/2004 | Levola |
| 2004/0135209 A1 | 7/2004 | Hsieh et al. |
| 2004/0195963 A1 | 10/2004 | Choi et al. |
| 2005/0179372 A1 | 8/2005 | Kawakami et al. |
| 2005/0225233 A1 | 10/2005 | Boroson et al. |
| 2005/0243107 A1 | 11/2005 | Haim et al. |
| 2005/0248705 A1 | 11/2005 | Smith et al. |
| 2005/0285878 A1 | 12/2005 | Singh et al. |
| 2006/0018025 A1 | 1/2006 | Sharon et al. |
| 2006/0038881 A1 | 2/2006 | Starkweather et al. |
| 2006/0044399 A1 | 3/2006 | Fredlund et al. |
| 2006/0054787 A1 | 3/2006 | Olsen et al. |
| 2006/0072206 A1 | 4/2006 | Tsuyuki et al. |
| 2006/0129951 A1 | 6/2006 | Vaananen et al. |
| 2006/0132914 A1 | 6/2006 | Weiss et al. |
| 2006/0139447 A1 | 6/2006 | Unkrich |
| 2006/0152646 A1 | 7/2006 | Schrader |
| 2006/0164382 A1 | 7/2006 | Kulas et al. |
| 2006/0215244 A1 | 9/2006 | Yosha et al. |
| 2006/0221448 A1 | 10/2006 | Nivon et al. |
| 2006/0228073 A1 | 10/2006 | Mukawa et al. |
| 2006/0249765 A1 | 11/2006 | Hsieh |
| 2007/0002412 A1 | 1/2007 | Aihara |
| 2007/0008456 A1 | 1/2007 | Lesage et al. |
| 2007/0023703 A1 | 2/2007 | Sunaoshi et al. |
| 2007/0027591 A1 | 2/2007 | Goldenberg et al. |
| 2007/0041684 A1 | 2/2007 | Popovich et al. |
| 2007/0097019 A1 | 5/2007 | Wynne-Powell et al. |
| 2007/0147673 A1 | 6/2007 | Crandall |
| 2007/0153395 A1 | 7/2007 | Repetto et al. |
| 2007/0177260 A1 | 8/2007 | Kuppenheimer et al. |
| 2007/0236959 A1 | 10/2007 | Tolbert |
| 2008/0007511 A1 | 1/2008 | Tsuboi et al. |
| 2008/0043100 A1 | 2/2008 | Sobel et al. |
| 2008/0088603 A1 | 4/2008 | Eliasson et al. |
| 2008/0088624 A1 | 4/2008 | Long et al. |
| 2008/0106677 A1 | 5/2008 | Kuan et al. |
| 2008/0117341 A1 | 5/2008 | McGrew |
| 2008/0150913 A1 | 6/2008 | Bell et al. |
| 2008/0174735 A1 | 7/2008 | Quach et al. |
| 2008/0232680 A1 | 9/2008 | Berestov et al. |
| 2008/0248852 A1 | 10/2008 | Rasmussen |
| 2008/0280682 A1 | 11/2008 | Brunner et al. |
| 2008/0285140 A1 | 11/2008 | Amitai |
| 2008/0297535 A1 | 12/2008 | Reinig |
| 2008/0303918 A1 | 12/2008 | Keithley |
| 2008/0311386 A1 | 12/2008 | Wendt |
| 2009/0015742 A1 | 1/2009 | Liao et al. |
| 2009/0051283 A1 | 2/2009 | Cok et al. |
| 2009/0097127 A1 | 4/2009 | Amitai |
| 2009/0128449 A1 | 5/2009 | Brown et al. |
| 2009/0128901 A1 | 5/2009 | Tilleman et al. |
| 2009/0189974 A1 | 7/2009 | Deering |
| 2009/0190003 A1 | 7/2009 | Park et al. |
| 2009/0244413 A1 | 10/2009 | Ishikawa et al. |
| 2009/0246707 A1 | 10/2009 | Li et al. |
| 2009/0256837 A1 | 10/2009 | Deb et al. |
| 2009/0262419 A1 | 10/2009 | Robinson et al. |
| 2010/0002989 A1 | 1/2010 | Tokushima |
| 2010/0021108 A1 | 1/2010 | Kang et al. |
| 2010/0053151 A1 | 3/2010 | Marti et al. |
| 2010/0060551 A1 | 3/2010 | Sugiyama et al. |
| 2010/0061078 A1 | 3/2010 | Kim |
| 2010/0084674 A1 | 4/2010 | Paetzold et al. |
| 2010/0096617 A1 | 4/2010 | Shanks |
| 2010/0103078 A1 | 4/2010 | Mukawa et al. |
| 2010/0134534 A1 | 6/2010 | Seesselberg et al. |
| 2010/0141905 A1 | 6/2010 | Burke |
| 2010/0149073 A1 | 6/2010 | Chaum et al. |
| 2010/0188353 A1 | 7/2010 | Yoon et al. |
| 2010/0200736 A1 | 8/2010 | Laycock et al. |
| 2010/0201953 A1 | 8/2010 | Freeman et al. |
| 2010/0213467 A1 | 8/2010 | Lee et al. |
| 2010/0229853 A1 | 9/2010 | Vandal et al. |
| 2010/0238270 A1 | 9/2010 | Bjelkhagen et al. |
| 2010/0238664 A1 | 9/2010 | Steenbergen |
| 2010/0245387 A1 | 9/2010 | Bachelder et al. |
| 2010/0271467 A1 | 10/2010 | Akeley |
| 2010/0277421 A1 | 11/2010 | Charlier et al. |
| 2010/0277439 A1 | 11/2010 | Charlier et al. |
| 2010/0277779 A1 | 11/2010 | Futterer et al. |
| 2010/0281439 A1 | 11/2010 | Markovic et al. |
| 2010/0309687 A1 | 12/2010 | Sampsell et al. |
| 2010/0317132 A1 | 12/2010 | Rogers et al. |
| 2010/0321609 A1 | 12/2010 | Qi et al. |
| 2010/0328351 A1 | 12/2010 | Tan |
| 2011/0012814 A1 | 1/2011 | Tanaka |
| 2011/0021251 A1 | 1/2011 | Lindén |
| 2011/0032482 A1 | 2/2011 | Agurok |
| 2011/0050547 A1 | 3/2011 | Mukawa |
| 2011/0050655 A1 | 3/2011 | Mukawa |
| 2011/0068699 A1 | 3/2011 | Knapp |
| 2011/0075442 A1 | 3/2011 | Chiang |
| 2011/0084893 A1 | 4/2011 | Lee et al. |
| 2011/0090343 A1 | 4/2011 | Alt et al. |
| 2011/0091156 A1 | 4/2011 | Laughlin |
| 2011/0114823 A1 | 5/2011 | Katzir et al. |
| 2011/0134017 A1 | 6/2011 | Burke |
| 2011/0141388 A1 | 6/2011 | Park et al. |
| 2011/0148931 A1 | 6/2011 | Kim |
| 2011/0163986 A1 | 7/2011 | Lee et al. |
| 2011/0194029 A1 | 8/2011 | Herrmann et al. |
| 2011/0205251 A1 | 8/2011 | Auld |
| 2011/0210946 A1 | 9/2011 | Goertz et al. |
| 2011/0214082 A1 | 9/2011 | Osterhout et al. |
| 2011/0215349 A1 | 9/2011 | An et al. |
| 2011/0221658 A1 | 9/2011 | Haddick et al. |
| 2011/0221659 A1 | 9/2011 | King et al. |
| 2011/0227820 A1 | 9/2011 | Haddick et al. |
| 2011/0227913 A1 | 9/2011 | Hyndman |
| 2011/0242145 A1 | 10/2011 | Nishimura et al. |
| 2011/0242392 A1 | 10/2011 | Chiang |
| 2011/0248904 A1 | 10/2011 | Miyawaki et al. |
| 2011/0248958 A1 | 10/2011 | Gruhlke et al. |
| 2011/0267799 A1 | 11/2011 | Epstein et al. |
| 2011/0283223 A1 | 11/2011 | Vaittinen et al. |
| 2011/0299044 A1* | 12/2011 | Yeh ............... G03B 21/005 353/52 |
| 2011/0304640 A1 | 12/2011 | Noge |
| 2011/0309378 A1 | 12/2011 | Lau et al. |
| 2011/0310232 A1 | 12/2011 | Wilson et al. |
| 2012/0013651 A1 | 1/2012 | Trayner et al. |
| 2012/0019434 A1 | 1/2012 | Kuhlman et al. |
| 2012/0026161 A1 | 2/2012 | Chen et al. |
| 2012/0033306 A1 | 2/2012 | Valera et al. |
| 2012/0038629 A1 | 2/2012 | Brown et al. |
| 2012/0041721 A1 | 2/2012 | Chen |
| 2012/0050144 A1 | 3/2012 | Morlock et al. |
| 2012/0052934 A1 | 3/2012 | Maharbiz et al. |
| 2012/0062998 A1 | 3/2012 | Schultz et al. |
| 2012/0069413 A1 | 3/2012 | Schultz |
| 2012/0083325 A1 | 4/2012 | Heatherly |
| 2012/0102438 A1 | 4/2012 | Robinson et al. |
| 2012/0105487 A1 | 5/2012 | Son et al. |
| 2012/0106170 A1 | 5/2012 | Matthews et al. |
| 2012/0113092 A1 | 5/2012 | Bar-Zeev et al. |
| 2012/0127577 A1 | 5/2012 | Desserouer |
| 2012/0157114 A1 | 6/2012 | Alameh et al. |
| 2012/0162764 A1 | 6/2012 | Shimizu |
| 2012/0176474 A1 | 7/2012 | Border |
| 2012/0188205 A1 | 7/2012 | Jansson et al. |

(56) References Cited

U.S. PATENT DOCUMENTS

| | | |
|---|---|---|
| 2012/0200495 A1 | 8/2012 | Johansson |
| 2012/0206589 A1 | 8/2012 | Crandall |
| 2012/0218301 A1 | 8/2012 | Miller |
| 2012/0227006 A1 | 9/2012 | Amm |
| 2012/0235885 A1 | 9/2012 | Miller et al. |
| 2012/0242561 A1 | 9/2012 | Sugihara |
| 2012/0242798 A1 | 9/2012 | Mcardle et al. |
| 2012/0249797 A1 | 10/2012 | Haddick et al. |
| 2012/0256856 A1 | 10/2012 | Suzuki et al. |
| 2012/0256963 A1 | 10/2012 | Suzuki et al. |
| 2012/0287381 A1 | 11/2012 | Li et al. |
| 2012/0292535 A1 | 11/2012 | Choi et al. |
| 2013/0027772 A1 | 1/2013 | Large |
| 2013/0033485 A1 | 2/2013 | Kollin et al. |
| 2013/0093741 A1 | 4/2013 | Akimoto et al. |
| 2013/0106674 A1 | 5/2013 | Wheeler et al. |
| 2013/0162673 A1 | 6/2013 | Bohn |
| 2013/0163089 A1 | 6/2013 | Bohn |
| 2013/0170031 A1 | 7/2013 | Bohn |
| 2013/0187943 A1 | 7/2013 | Bohn et al. |
| 2013/0201285 A1 | 8/2013 | Mao et al. |
| 2013/0207896 A1 | 8/2013 | Robinson et al. |
| 2013/0207964 A1 | 8/2013 | Fleck |
| 2013/0208003 A1 | 8/2013 | Bohn |
| 2013/0208362 A1 | 8/2013 | Bohn |
| 2013/0208482 A1 | 8/2013 | Fleck |
| 2013/0215081 A1 | 8/2013 | Levin et al. |
| 2013/0242056 A1 | 9/2013 | Fleck |
| 2013/0242555 A1 | 9/2013 | Mukawa |
| 2013/0250431 A1 | 9/2013 | Robbins et al. |
| 2013/0252628 A1 | 9/2013 | Kuehnel |
| 2013/0257848 A1 | 10/2013 | Westerinen et al. |
| 2013/0258701 A1 | 10/2013 | Westerinen et al. |
| 2013/0267309 A1 | 10/2013 | Robbins |
| 2013/0307875 A1 | 11/2013 | Anderson |
| 2013/0314793 A1 | 11/2013 | Robbins |
| 2013/0322810 A1 | 12/2013 | Robbins |
| 2013/0335671 A1 | 12/2013 | Fleck |
| 2013/0342674 A1 | 12/2013 | Dixon |
| 2014/0010265 A1 | 1/2014 | Peng |
| 2014/0078130 A1 | 3/2014 | Uchino et al. |
| 2014/0104665 A1 | 4/2014 | Popovich et al. |
| 2014/0104685 A1 | 4/2014 | Bohn |
| 2014/0111865 A1 | 4/2014 | Kobayashi |
| 2014/0140653 A1 | 5/2014 | Brown et al. |
| 2014/0140654 A1 | 5/2014 | Brown et al. |
| 2014/0176528 A1 | 6/2014 | Robbins |
| 2014/0184699 A1 | 7/2014 | Ito et al. |
| 2014/0204455 A1 | 7/2014 | Popovich |
| 2014/0240842 A1 | 8/2014 | Nguyen et al. |
| 2014/0320399 A1 | 10/2014 | Kim et al. |
| 2015/0168731 A1 | 6/2015 | Robbins |
| 2015/0227231 A1 | 8/2015 | Chen |
| 2016/0033697 A1 | 2/2016 | Sainiemi et al. |
| 2016/0035539 A1 | 2/2016 | Sainiemi et al. |
| 2016/0231570 A1 | 8/2016 | Levola et al. |
| 2016/0234485 A1 | 8/2016 | Robbins et al. |

FOREIGN PATENT DOCUMENTS

| | | |
|---|---|---|
| CN | 101589326 | 11/2009 |
| CN | 201491069 | 5/2010 |
| CN | 101881936 | 11/2010 |
| CN | 102004315 | 4/2011 |
| CN | 102156555 | 8/2011 |
| DE | 102007021036 | 11/2008 |
| EP | 0977022 | 2/2000 |
| EP | 2065750 | 6/2009 |
| EP | 2112547 | 10/2009 |
| EP | 2216678 | 1/2010 |
| EP | 2700987 | 2/2014 |
| EP | 3018524 | 5/2016 |
| JP | H02227340 | 9/1990 |
| JP | H0422358 | 1/1992 |
| JP | 7311303 | 11/1995 |
| JP | H08190640 | 7/1996 |
| JP | 2001078234 | 3/2001 |
| JP | 2005309638 | 11/2005 |
| JP | 2006349921 | 12/2006 |
| JP | 2008017135 | 1/2008 |
| JP | 2008097599 | 4/2008 |
| JP | 2008518368 | 5/2008 |
| JP | 201061545 | 3/2010 |
| KR | 20090076539 | 7/2009 |
| KR | 20110070087 | 6/2011 |
| KR | 20120023458 | 3/2012 |
| TW | 200846700 | 12/2008 |
| WO | WO-9418595 | 8/1994 |
| WO | WO-2001033282 | 5/2001 |
| WO | WO-0195027 | 12/2001 |
| WO | WO-03090611 | 11/2003 |
| WO | WO-2006054056 | 5/2006 |
| WO | WO-2010125337 | 11/2010 |
| WO | WO-2011003381 | 1/2011 |
| WO | WO-2011041466 | 4/2011 |
| WO | WO-2011051660 | 5/2011 |
| WO | WO-2011110728 | 9/2011 |
| WO | WO-2011131978 | 10/2011 |
| WO | WO-2012172295 | 12/2012 |
| WO | WO-2013164665 | 11/2013 |
| WO | WO-2014130383 | 8/2014 |

OTHER PUBLICATIONS

"Examiner's Answer to Appeal Brief", U.S. Appl. No. 13/477,646, Oct. 26, 2016, 12 pages.

"Final Office Action", U.S. Appl. No. 13/397,617, Sep. 21, 2016, 10 pages.

"Foreign Office Action", CN Application No. 201380067523.1, Aug. 22, 2016, 13 pages.

"Non-Final Office Action", U.S. Appl. No. 13/397,539, Sep. 9, 2016, 16 pages.

"Non-Final Office Action", U.S. Appl. No. 13/432,311, Aug. 17, 2016, 18 pages.

"Non-Final Office Action", U.S. Appl. No. 13/440,165, Sep. 22, 2016, 13 pages.

"Non-Final Office Action", U.S. Appl. No. 14/617,606, Sep. 9, 2016, 12 pages.

"Notice of Allowance", U.S. Appl. No. 13/420,388, Oct. 6, 2016, 5 pages.

"Notice of Allowance", U.S. Appl. No. 14/635,474, Oct. 17, 2016, 10 pages.

"Advisory Action", U.S. Appl. No. 13/428,879, Sep. 19, 2014, 3 pages.

"Advisory Action", U.S. Appl. No. 13/432,311, Mar. 24, 2016, 3 pages.

"Augmented Reality and Physical Games", U.S. Appl. No. 13/440,165, Apr. 5, 2012, 49 pages.

"BragGrate Mirror", Retrieved from <http://web.archive.org/web/20090814104232/http://www.optigrate.com/BragGrate_Mirror.html> on Jul. 8, 2014, Aug. 14, 2009, 2 pages.

"Corrected Final Office Action", U.S. Appl. No. 13/432,311, Dec. 24, 2014, 25 pages.

"Corrected Notice of Allowance", U.S. Appl. No. 13/336,873, Sep. 11, 2015, 4 pages.

"Corrected Notice of Allowance", U.S. Appl. No. 13/336,873, Nov. 27, 2015, 4 pages.

"Corrected Notice of Allowance", U.S. Appl. No. 13/397,495, Mar. 3, 2016, 4 pages.

"Corrected Notice of Allowance", U.S. Appl. No. 13/397,516, Mar. 3, 2016, 2 pages.

"Corrected Notice of Allowance", U.S. Appl. No. 13/397,516, May 16, 2016, 2 pages.

"DigiLens", SBG Labs—retrieved from <http://www.digilens.com/products.html> on Jun. 19, 2012, 1 page.

"Final Office Action", U.S. Appl. No. 13/336,873, Jan. 5, 2015, 21 pages.

"Final Office Action", U.S. Appl. No. 13/336,895, May 27, 2014, 11 pages.

(56) References Cited

OTHER PUBLICATIONS

"Final Office Action", U.S. Appl. No. 13/397,495, May 29, 2014, 10 pages.
"Final Office Action", U.S. Appl. No. 13/397,516, Jan. 29, 2015, 13 pages.
"Final Office Action", U.S. Appl. No. 13/397,539, Apr. 21, 2016, 14 pages.
"Final Office Action", U.S. Appl. No. 13/397,539, Jun. 29, 2015, 11 pages.
"Final Office Action", U.S. Appl. No. 13/397,617, Nov. 18, 2015, 11 pages.
"Final Office Action", U.S. Appl. No. 13/420,388, Apr. 21, 2016, 9 pages.
"Final Office Action", U.S. Appl. No. 13/428,879, Jul. 14, 2014, 12 pages.
"Final Office Action", U.S. Appl. No. 13/428,879, Dec. 10, 2015, 16 pages.
"Final Office Action", U.S. Appl. No. 13/432,311, Dec. 15, 2014, 24 pages.
"Final Office Action", U.S. Appl. No. 13/432,311, Dec. 18, 2015, 9 pages.
"Final Office Action", U.S. Appl. No. 13/432,372, Jan. 29, 2015, 33 pages.
"Final Office Action", U.S. Appl. No. 13/440,165, Jun. 6, 2014, 12 pages.
"Final Office Action", U.S. Appl. No. 13/440,165, Jul. 21, 2015, 11 pages.
"Final Office Action", U.S. Appl. No. 13/477,646, Feb. 23, 2015, 36 pages.
"Final Office Action", U.S. Appl. No. 13/477,646, Nov. 24, 2015, 39 pages.
"Final Office Action", U.S. Appl. No. 13/477,646, May 5, 2014, 26 pages.
"Final Office Action", U.S. Appl. No. 13/722,917, Sep. 23, 2015, 14 pages.
"Final Office Action", U.S. Appl. No. 13/774,875, Apr. 22, 2016, 10 pages.
"Final Office Action", U.S. Appl. No. 13/774,875, Jun. 4, 2015, 10 pages.
"Final Office Action", U.S. Appl. No. 14/134,993, Jul. 16, 2015, 19 pages.
"Final Office Action", U.S. Appl. No. 14/134,993, Aug. 20, 2014, 15 pages.
"Final Office Action", U.S. Appl. No. 14/178,731, Aug. 12, 2015, 13 pages.
"Foreign Notice of Allowance", CN Application No. 201210563730.3, Nov. 30, 2015, 4 Pages.
"Foreign Office Action", CN Application No. 201210563730.3, Jan. 7, 2015, 16 pages.
"Foreign Office Action", CN Application No. 201210563730.3, Aug. 14, 2015, 4 Pages.
"Foreign Office Action", CN Application No. 201210567932.5, Aug. 14, 2014, 12 pages.
"Foreign Office Action", EP Application No. 13765041.2, Aug. 5, 2015, 6 pages.
"Foreign Office Action", EP Application No. 13769961.7, Mar. 11, 2015, 8 pages.
"Foreign Office Action", EP Application No. 13769961.7, Jun. 30, 2015, 6 pages.
"Foreign Office Action", EP Application No. 13770174.4, Jul. 1, 2015, 6 pages.
"HDTV Helmet Mounted Display", Available at <http://defense-update.com/products/h/HDTV-HMD.htm>, Jan. 26, 2005, 1 page.
"International Search Report and Written Opinion", Application No. PCT/US2012/069331, Mar. 29, 2013, 10 pages.
"International Search Report and Written Opinion", Application No. PCT/US2014/016658, Apr. 23, 2014, 10 pages.
"International Search Report and Written Opinion", Application No. PCT/US2013/030632, Jun. 26, 2013, 10 pages.
"International Search Report and Written Opinion", Application No. PCT/US2016/015496, Apr. 11, 2016, 11 pages.
"International Search Report and Written Opinion", Application No. PCT/US2016/015873, May 23, 2016, 11 pages.
"International Search Report and Written Opinion", Application No. PCT/US2013/028477, Jun. 21, 2013, 11 pages.
"International Search Report and Written Opinion", Application No. PCT/US2013/031111, Jun. 26, 2013, 11 pages.
"International Search Report and Written Opinion", Application No. PCT/US2015/041900, Oct. 21, 2015, 12 pages.
"International Search Report and Written Opinion", Application No. PCT/US2013/076832, Mar. 17, 2014, 12 pages.
"International Search Report and Written Opinion", Application No. PCT/US2015/041909, Oct. 20, 2015, 13 pages.
"International Search Report and Written Opinion", Application No. PCT/US2012/071563, Apr. 25, 2013, 13 pages.
"International Search Report and Written Opinion", Application No. PCT/US2012/069330, Mar. 28, 2013, 9 pages.
"International Search Report and Written Opinion", Application No. PCT/US2013/026200, Jun. 3, 2013, 9 pages.
"Light Guide Techniques using LED Lamps", Application Brief I-003, retrieved from <http://www.ciri.org.nz/downloads/Lightpipe%20design.pdf> on Jan. 12, 2012, Oct. 14, 2008, 22 pages.
"Non-Final Office Action", U.S. Appl. No. 13/397,495, Nov. 13, 2013, 8 pages.
"Non-Final Office Action", U.S. Appl. No. 13/440,165, Feb. 6, 2014, 12 pages.
"Non-Final Office Action", U.S. Appl. No. 13/336,873, Apr. 9, 2015, 18 pages.
"Non-Final Office Action", U.S. Appl. No. 13/336,873, Jul. 25, 2014, 16 pages.
"Non-Final Office Action", U.S. Appl. No. 13/336,895, Oct. 24, 2013, 9 pages.
"Non-Final Office Action", U.S. Appl. No. 13/343,675, Jul. 16, 2013, 9 pages.
"Non-Final Office Action", U.S. Appl. No. 13/397,495, Apr. 3, 2015, 11 pages.
"Non-Final Office Action", U.S. Appl. No. 13/397,516, Jun. 12, 2014, 11 pages.
"Non-Final Office Action", U.S. Appl. No. 13/397,516, Sep. 24, 2015, 14 pages.
"Non-Final Office Action", U.S. Appl. No. 13/397,516, Nov. 25, 2013, 10 pages.
"Non-Final Office Action", U.S. Appl. No. 13/397,539, Mar. 16, 2015, 9 pages.
"Non-Final Office Action", U.S. Appl. No. 13/397,539, Oct. 1, 2015, 12 pages.
"Non-Final Office Action", U.S. Appl. No. 13/397,617, May 5, 2015, 6 pages.
"Non-Final Office Action", U.S. Appl. No. 13/397,617, May 18, 2016, 8 pages.
"Non-Final Office Action", U.S. Appl. No. 13/397,617, Oct. 9, 2014, 6 pages.
"Non-Final Office Action", U.S. Appl. No. 13/420,388, Dec. 4, 2015, 7 pages.
"Non-Final Office Action", U.S. Appl. No. 13/428,879, Feb. 24, 2015, 10 pages.
"Non-Final Office Action", U.S. Appl. No. 13/428,879, Mar. 17, 2014, 10 pages.
"Non-Final Office Action", U.S. Appl. No. 13/428,879, Jun. 26, 2015, 13 pages.
"Non-Final Office Action", U.S. Appl. No. 13/432,311, Jun. 2, 2015, 25 pages.
"Non-Final Office Action", U.S. Appl. No. 13/432,311, Jul. 8, 2014, 33 pages.
"Non-Final Office Action", U.S. Appl. No. 13/432,372, May 9, 2014, 26 pages.
"Non-Final Office Action", U.S. Appl. No. 13/432,372, Oct. 24, 2014, 27 pages.
"Non-Final Office Action", U.S. Appl. No. 13/440,165, Feb. 13, 2015, 10 pages.
"Non-Final Office Action", U.S. Appl. No. 13/440,165, Mar. 28, 2016, 13 pages.

(56) References Cited

OTHER PUBLICATIONS

"Non-Final Office Action", U.S. Appl. No. 13/440,165, Oct. 16, 2014, 11 pages.
"Non-Final Office Action", U.S. Appl. No. 13/477,646, Jun. 18, 2015, 43 pages.
"Non-Final Office Action", U.S. Appl. No. 13/477,646, Oct. 6, 2014, 34 pages.
"Non-Final Office Action", U.S. Appl. No. 13/477,646, Nov. 22, 2013, 20 pages.
"Non-Final Office Action", U.S. Appl. No. 13/525,649, Jan. 29, 2014, 7 pages.
"Non-Final Office Action", U.S. Appl. No. 13/525,649, Jun. 5, 2014, 7 pages.
"Non-Final Office Action", U.S. Appl. No. 13/722,917, Feb. 9, 2016, 17 pages.
"Non-Final Office Action", U.S. Appl. No. 13/722,917, May 21, 2015, 12 pages.
"Non-Final Office Action", U.S. Appl. No. 13/774,875, Sep. 16, 2015, 8 pages.
"Non-Final Office Action", U.S. Appl. No. 13/774,875, Nov. 24, 2014, 8 pages.
"Non-Final Office Action", U.S. Appl. No. 14/134,993, Jan. 22, 2015, 17 pages.
"Non-Final Office Action", U.S. Appl. No. 14/134,993, Apr. 17, 2014, 34 pages.
"Non-Final Office Action", U.S. Appl. No. 14/617,606, May 23, 2016, 12 pages.
"Notice of Allowance", U.S. Appl. No. 13/336,873, Jul. 31, 2015, 6 pages.
"Notice of Allowance", U.S. Appl. No. 13/336,895, Aug. 11, 2014, 6 pages.
"Notice of Allowance", U.S. Appl. No. 13/343,675, Sep. 16, 2013, 8 pages.
"Notice of Allowance", U.S. Appl. No. 13/356,545, Mar. 28, 2014, 6 pages.
"Notice of Allowance", U.S. Appl. No. 13/397,495, Oct. 20, 2015, 6 pages.
"Notice of Allowance", U.S. Appl. No. 13/397,516, Feb. 1, 2016, 7 pages.
"Notice of Allowance", U.S. Appl. No. 13/488,145, Nov. 19, 2014, 8 pages.
"Notice of Allowance", U.S. Appl. No. 14/134,993, Nov. 17, 2015, 9 pages.
"Restriction Requirement", U.S. Appl. No. 13/397,539, Dec. 1, 2014, 6 pages.
"Restriction Requirement", U.S. Appl. No. 13/420,388, Aug. 13, 2015, 6 pages.
"Restriction Requirement", U.S. Appl. No. 13/488,145, Sep. 8, 2014, 14 pages.
"Restriction Requirement", U.S. Appl. No. 14/447,419, Aug. 4, 2015, 6 pages.
"Supplemental Notice of Allowance", U.S. Appl. No. 13/356,545, Jul. 22, 2014, 2 pages.
"Supplemental Notice of Allowance", U.S. Appl. No. 13/397,495, Jan. 26, 2016, 4 pages.
"Supplemental Notice of Allowance", U.S. Appl. No. 14/134,993, Mar. 2, 2016, 6 pages.
"Supplemental Notice of Allowance", U.S. Appl. No. 14/447,464, Jan. 12, 2016, 2 pages.
"Supplementary European Search Report", EP Application No. 13765041.2, Jul. 21, 2015, 3 pages.
"Supplementary European Search Report", EP Application No. 13769961.7, Mar. 3, 2015, 3 pages.
"Two-Faced: Transparent Phone with Dual Touch Screens", Retrieved from <http://gajitz.com/two-faced-transparent-phone-with-dual-touch-screens/>, Jun. 7, 2012, 3 pages.
Allen,"ELiXIR—Solid-State Luminaire with Enhanced Light Extraction by Internal Reflection", Journal of Display Technology, vol. 3, No. 2, Available at <http://www.nanolab.uc.edu/Publications/PDFfiles/355.pdf>, Jun. 2007, pp. 155-159.
Ando,"Development of Three-Dimensional Microstages Using Inclined Deep-Reactive Ion Etching", Journal of Microelectromechanical Systems, Jun. 1, 2007, 10 pages.
Baluja,"Non-Intrusive Gaze Tracking Using Artificial Neural Networks", Technical Report CMU-CS-94-102, Available at <http://citeseerx.ist.psu.edu/viewdoc/download?doi=10.1.1.33.4027&rep=rep1&type=pdf> , Jan. 5, 1994, 14 pages.
Baudisch,"Back-of-Device Interaction Allows Creating Very Small Touch Devices", in Proceedings of 27th International Conference on Human Factors in Computing Systems, Retrieved from <http://citeseerx.ist.psu.edu/viewdoc/download?doi=10.1.1.160.3337&rep=rep1&type=pdf>, Apr. 2005, 10 pages.
Chen,"Strategies for 3D Video with Wide Fields-of-View", IEEE Proceeding Optoelectronics, vol. 148, Issue 2, Available at <http://ieeexplore.ieee.org/stamp/stamp.jsp?tp=&arnumber=926823>, Apr. 2001, pp. 85-90.
Cheng,"Waveguide Displays Based on Polymer-dispersed Liquid Crystals", SPIE Newsroom, Available at <http://spie.org/documents/Newsroom/Imported/003805/003805_10.pdf>, Aug. 12, 2011, 2 pages.
DeAgazio,"Selecting Display Backlighting for Portable, Handheld Devices", Hearst Electronics Products, retrieved from <http://www2.electronicproducts.com/Selecting_display_backlighting_for_portable_handheld_devices-article-farcglobal-feb2008-html.aspx> on Jan. 12, 2012, Jan. 2, 2008, 4 pages.
Eadicicco,"First Transparent Tablet Lets You Touch From Both Sides", Retrieved from <http://blog.laptopmag.com/first-transparent-tablet>, Dec. 26, 2013, 4 pages.
Gila,"First Results From a Multi-Ion Beam Lithography and Processing System at the University of Florida", AIP Conference Proceedings, Jun. 1, 2011, 6 pages.
Han,"Accurate diffraction efficiency control for multiplexed volume holographic gratings", Retrieved at: opticalengineering.spiedigitallibrary.org/data/Journals/.../2799_1, 2002, 4 pages.
Hua, "Engineering of Head-mounted Projective Displays", In Proceedings of Applied Optics, vol. 39, No. 22, Aug. 1, 2000, 11 pages.
Jacques,"Polarized Light Imaging of Tissue", Available at <http://www.lumamed.com/documents/5_polarized%20light%20imaging.pdf>, 2004, 17 pages.
Jarvenpaa,"Compact near-to-eye display with integrated gaze tracker", Second International Conference on Computer Engineering and Applications, Mar. 19, 2010, 9 pages.
Karp,"Planar Micro-optic Solar Concentration using Multiple Imaging Lenses into a Common Slab Waveguide", in Proceedings of SPIE vol. 7407, Available at <http://psilab.ucsd.edu/research/slab_concentration/files/SPIE_Slab_Published.pdf>, Jan. 2009, 11 pages.
Kress,"Exit Pupil for Wearable See-through displays", Downloaded From: http://proceedings.spiedigitallibrary.org/ on Jan. 31, 2015 Terms of Use: http://spiedl.org/terms, 2012, 8 pages.
Lanman,"Near-eye Light Field Displays", In Journal of ACM Transactions on Graphics, vol. 32, No. 6, Nov. 2013, 10 pages.
Large,"Parallel Optics in Waveguide Displays: a Flat Panel Autostereoscopic", Display Technology, Journal of, Retrieved from <http://download.microsoft.com/download/D/2/E/D2E425F8-CF3C-4C71-A4A2-70F9D4081007/ParallelOpticsinWaveguideDisplaysMS090925.Final.pdf>, Jun. 21, 2010, pp. 1-7.
Li,"Design Optimization of Reflective Polarizers for LCD Backlight Recycling", Journal of Display Technology, vol. 5, No. 8, Available at <http://ieeexplore.ieee.org/stamp/stamp.jsp?tp=&arnumber=5196840 >, Aug. 2009, pp. 335-340.
Li,"Switchable Electro-optic Diffractive Lens with High Efficiency for Ophthalmic Applications", PNAS Apr. 18, 2006 vol. 103 No. 16 6100-6104, Retrieved from: <http://www.pnas.org/content/103/16/6100.long> Feb. 22, 2012, Feb. 2, 2006, 4 pages.
Massenot,"Multiplexed holographic transmission gratings recorded in holographic polymer-dispersed liquid crystals: static and dynamic studies", Retrieved at: http://oatao.univ-toulouse.fr/2874/, 2005, 8 pages.
Melcher,"LCoS for High Performance Displays", In Proceedings of LEOS 2003, Available at <http://ieeexplore.ieee.org/stamp/stamp.jsp?tp=&arnumber=1253048>, Oct. 27, 2003, pp. 812-813.

(56) References Cited

OTHER PUBLICATIONS

Minier,"Diffraction Characteristics of Superimposed Holographic gratings in Planar Optical waveguides", IEEE Photonics Technology Letters, vol. 4, No. 10, Oct. 1992, 4 pages.

Pu,"Exposure schedule for multiplexing holograms in photopolymer films", Retrieved at: lo.epfl.ch/webdav/site/lo/shared/1996/OE__35__2824__Oct1996.pdf, Oct. 1996, 6 pages.

Scott,"RearType: Text Entry Using Keys on the Back of a Device", In Proceedings of 12th Conference on Human-Computer Interaction with Mobile Devices and Services, Retrieved from <https://research.microsoft.com/pubs/135609/reartype%20mobilehci.pdf>, Sep. 7, 2010, 9 pages.

Singh"Laser-Based Head-Tracked 3D Display Research", Journal of Display Technology, vol. 6, No. 10, Available at <http://ieeexplore.ieee.org/stamp/stamp.jsp?tp=&arnumber=5462999>, Oct. 2010, pp. 531-543.

Travis,"Collimated Light from a Waveguide for a Display Backlight", Optics Express—Retrieved from <http://download.microsoft.com/download/D/2/E/D2E425F8-CF3C-4C71-A4A2-70F9D4081007/OpticsExpressbacklightpaper.pdf>, Oct. 15, 2009, pp. 19714-19719.

Travis,"The Design of Backlights for View-Sequential 3D", Microsoft Corporation, Available at <http://download.microsoft.com/download/D/2/E/D2E425F8-CF3C-4C71-A4A2-70F9D4081007/Backlightforviewsequentialautostereo.docx>, Jul. 3, 2010, 4 pages.

van"A Survey of Augmented Reality Technologies, Applications and Limitations", The International Journal of Virtual Reality, 2010, 9(2), Available at <http://www.ijvr.org/issues/issue2-2010/paper1%20.pdf>, Jun. 2010, pp. 1-19.

Westerinen,"Light Guide Display and Field of View", U.S. Appl. No. 13/428,879, Mar. 23, 2012, 46 pages.

Wigdor,"LucidTouch: A See-Through Mobile Device", In Proceedings of 20th Annual ACM symposium on User Interface Software and Technology, Retrieved from <http://d1.acm.org/citation.cfm?id=1294259>, Oct. 7, 2007, 10 pages.

Yan,"Multiplexing holograms in the photopolymer with equal diffraction efficiency", 2005, 9 pages.

Zharkova,"Study of the Dynamics of Transmission Gratings Growth on Holographic Polymer-Dispersed Liquid Crystals", International Conference on Methods of Aerophysical Research, ICMAR 2008, 2008, 4 pages.

"Final Office Action", U.S. Appl. No. 13/722,917, Jun. 17, 2016, 19 pages.

"Foreign Office Action", CN Application No. 201380015757.1, Jul. 11, 2016, 13 pages.

"Foreign Office Action", CN Application No. 201380017348.5, Jan. 14, 2016, 12 pages.

"Foreign Office Action", CN Application No. 201380017348.5, Jun. 17, 2016, 7 pages.

"Foreign Office Action", CN Application No. 201380017348.5, Oct. 18, 2016, 7 pages.

"Foreign Office Action", EP Application No. 13765041.2, Aug. 4, 2016, 5 pages.

"Restriction Requirement", U.S. Appl. No. 14/635,474, Jul. 12, 2016, 5 pages.

"Final Office Action", U.S. Appl. No. 14/617,606, Dec. 27, 2016, 13 pages.

"Foreign Office Action(", TW Application No. 102101510, Dec. 6, 2016, 11 pages.

"International Preliminary Report on Patentability", Application No. PCT/US2015/041900, Oct. 11, 2016, 6 pages.

"Non-Final Office Action", U.S. Appl. No. 13/397,617, Jan. 12, 2017, 10 pages.

"Non-Final Office Action", U.S. Appl. No. 13/722,917, Dec. 6, 2016, 18 pages.

"Non-Final Office Action", U.S. Appl. No. 14/617,769, Jan. 12, 2017, 10 pages.

Schrauwen,"Focused-Ion-Beam Fabrication of Slanted Grating Couplers in Silicon-on-Insulator Waveguides", IEEE Photonics Technology Letters, vol. 19, Issue 11, Jun. 1, 2007, 3 pages.

"Foreign Office Action", AU Application No. 2013361148, Feb. 15, 2017, 3 pages.

"Foreign Office Action", JP Application No. 2015-501688, Dec. 20, 2016, 8 pages.

"Second Written Opinion", Application No. PCT/US2016/015496, Feb. 9, 2017, 7 pages.

"Second Written Opinion", Application No. PCT/US2016/015869, Jan. 20, 2017, 5 pages.

"Second Written Opinion", Application No. PCT/US2016/015873, Feb. 6, 2017, 6 pages.

"Supplemental Notice of Allowance", U.S. Appl. No. 14/635,474, Feb. 2, 2017, 4 pages.

"Corrected Notice of Allowance", U.S. Appl. No. 13/397,539, Apr. 12, 2017, 2 pages.

"Foreign Notice of Allowance", TW Application No. 102101510, Mar. 23, 2017, 4 pages.

"Foreign Office Action", CN Application No. 201380015757.1, Mar. 27, 2017, 12 pages.

"Foreign Office Action", CN Application No. 201380067523.1, Apr. 17, 2017, 6 pages.

"Non-Final Office Action", U.S. Appl. No. 14/617,606, Mar. 27, 2017, 14 pages.

"Notice of Allowance", U.S. Appl. No. 13/397,539, Mar. 22, 2017, 7 pages.

"Notice of Allowance", U.S. Appl. No. 13/397,617, Apr. 25, 2017, 5 pages.

"Notice of Allowance", U.S. Appl. No. 13/440,165, Mar. 23, 2017, 5 pages.

* cited by examiner

IMAGING STRUCTURE WITH EMBEDDED LIGHT SOURCES

RELATED APPLICATION

This application is a continuation of and claims priority to U.S. patent application Ser. No. 13/397,516 filed Feb. 15, 2012 entitled "Imaging Structure with Embedded Light Sources", the disclosure of which is incorporated by reference herein in its entirety.

BACKGROUND

Virtual reality can be viewed as a computer-generated simulated environment in which a user has an apparent physical presence. A virtual reality experience can be generated in 3D and viewed with a head-mounted display (HMD), such as glasses or other wearable display device that has near-eye display panels as lenses to display a virtual reality environment, which replaces the actual environment. Augmented reality, however, provides that a user can still see through the display lenses of the glasses or other wearable display device to view the surrounding environment, yet also see images of virtual objects that are generated for display and appear as a part of the environment. Augmented reality can include any type of input such as audio and haptic inputs, as well as virtual images, graphics, and video that enhances or augments the environment that a user experiences. As an emerging technology, there are many challenges and design constraints with augmented reality, from generation of the virtual objects and images so that they appear realistic in a real environment, to developing the optics small and precise enough for implementation with a wearable display device. There are also challenges to developing illumination sources for implementation as micro projectors and/or imaging units for wearable display devices.

Conventional LCOS (liquid crystal on silicon) projection technologies use an LED (light emitting diode) or laser source to generate light that is reflected off of a silicon transistor array covered by an LCD (liquid crystal display) material to either reflect and/or change the polarization of the light. The LCOS reflective technology uses liquid crystals instead of individual DLP (digital light processing) mirrors. The liquid crystals are applied to a reflective mirror substrate and, as the liquid crystals open and close, the light is either reflected from the mirror below or blocked to modulate the emitted light. LCOS-based projectors typically use three LCOS chips, one each to modulate the red, green, and blue (RGB) components of the light. Similar to an LCD projector which uses three LCD panels, both LCOS and LCD projectors simultaneously project the red, green, and blue components of the light, such as for display on a display screen. A conventional display technology utilizes OLEDs (organic light emitting diodes) that generate light when current is applied through layers of the organic material. Although OLED cells can be individually controlled for illumination, unlike the LCOS material, the OLEDs are not viable for projection illumination because they do not emit enough light.

Some conventional LED array scanning systems for display technologies that have large optical systems are typically too large and complex to be implemented in imaging units for wearable display devices. Limitations of the current technology include the ability to modulate emitters in sequence in a scanning system, which can result in a slow refresh rate, a blurred image quality, and/or limited color depth. Another limitation of conventional LED array scanning systems is the relatively larger pitch between the LED emitters, which results in a larger optical system with size and weight barriers to implementation in a consumer HMD product. The light that is emitted for LED array scanning is moved across a surface, such as via a MEMS (micro-electromechanical systems) mirror, LC scanner, or by moving optics. However, the light efficiency of each emitter can vary based on production and material variances, bonding issues, connectivity issues, driver variance, micro-optics, color conversion variance, temperature, and/or optic differences across the surface.

SUMMARY

This Summary introduces simplified concepts of an imaging structure with embedded light sources, and the concepts are further described below in the Detailed Description and/or shown in the Figures. This Summary should not be considered to describe essential features of the claimed subject matter, nor used to determine or limit the scope of the claimed subject matter.

An imaging structure with embedded light sources is described. In embodiments, an imaging structure includes a silicon backplane with a driver pad array. The embedded light sources are formed on the driver pad array in an emitter material layer, and the embedded light sources can be individually controlled at the driver pad array to generate and emit light. A conductive material layer over the embedded light sources forms a p-n junction between the emitter material layer and the conductive material layer. Micro lens optics can be positioned over the conductive material layer to direct the light that is emitted from the embedded light sources. Further, the micro lens optics may be implemented as parabolic optics to concentrate the light that is emitted from the embedded light sources.

In other embodiments, the embedded light sources are formed in inorganic material as LEDs or lasers for direct light emission. The LEDs can be formed as individual emitters formed in the emitter material layer to approximate parabolic reflection that directs reflected light from within the inorganic material. The individual emitters are formed in the emitter material layer for individual current-based control at the driver pad array. The emitter material layer can include a reflective structure to reflect the light to exit the individual emitter cells. The embedded light sources include red, green, and blue (RGB) direct emitters that form the imaging structure as a one-dimensional array or two-dimensional array of the embedded light sources. The imaging structure may also be designed as a fault-tolerant array of sections of the embedded light sources, where a section includes redundant embedded light sources that can be controlled for increased illumination in an event that one of the redundant embedded light sources fails.

BRIEF DESCRIPTION OF THE DRAWINGS

Embodiments of an imaging structure with embedded light sources are described with reference to the following Figures. The same numbers may be used throughout to reference like features and components that are shown in the Figures.

DETAILED DESCRIPTION

Embodiments of an imaging structure with embedded light sources are described. An imaging structure can be formed in inorganic material and implemented for individual cell control (e.g., individual pixel control), where each cell is a direct emitter designed to emit a bright output of light that can be used for a number of optical solutions, such as with light guides, free form optics, and/or direct projection. For example, light that is emitted from the embedded light sources (e.g., RGB iLEDs or lasers) can be reflected through a micro lens optic and then directed in an imaging system of a wearable display device (e.g., glasses or a head-mounted display), such as reflected off of a MEMS mirror and then directed into a waveguide or otherwise projected.

In embodiments, implementations of the imaging structure emits light that can be utilized for waveguide, projection, and/or free form optics solutions. In embodiments, an imaging structure with embedded light sources provides several benefits over conventional techniques, such as reduced power consumption, which may be as little as one-sixth of conventional solutions due in part to independent pixel control. Other benefits include the smaller size of the imaging structure because the imager and light source are implemented as one structure, and improved quality of image due to a strong reduction of stray light, such as may be seen with traditional LCOS solutions.

While features and concepts of an imaging structure with embedded light sources can be implemented in any number of different devices, systems, environments, and/or configurations, embodiments of an imaging structure with embedded light sources are described in the context of the following example devices, systems, and methods.

Figure 1:
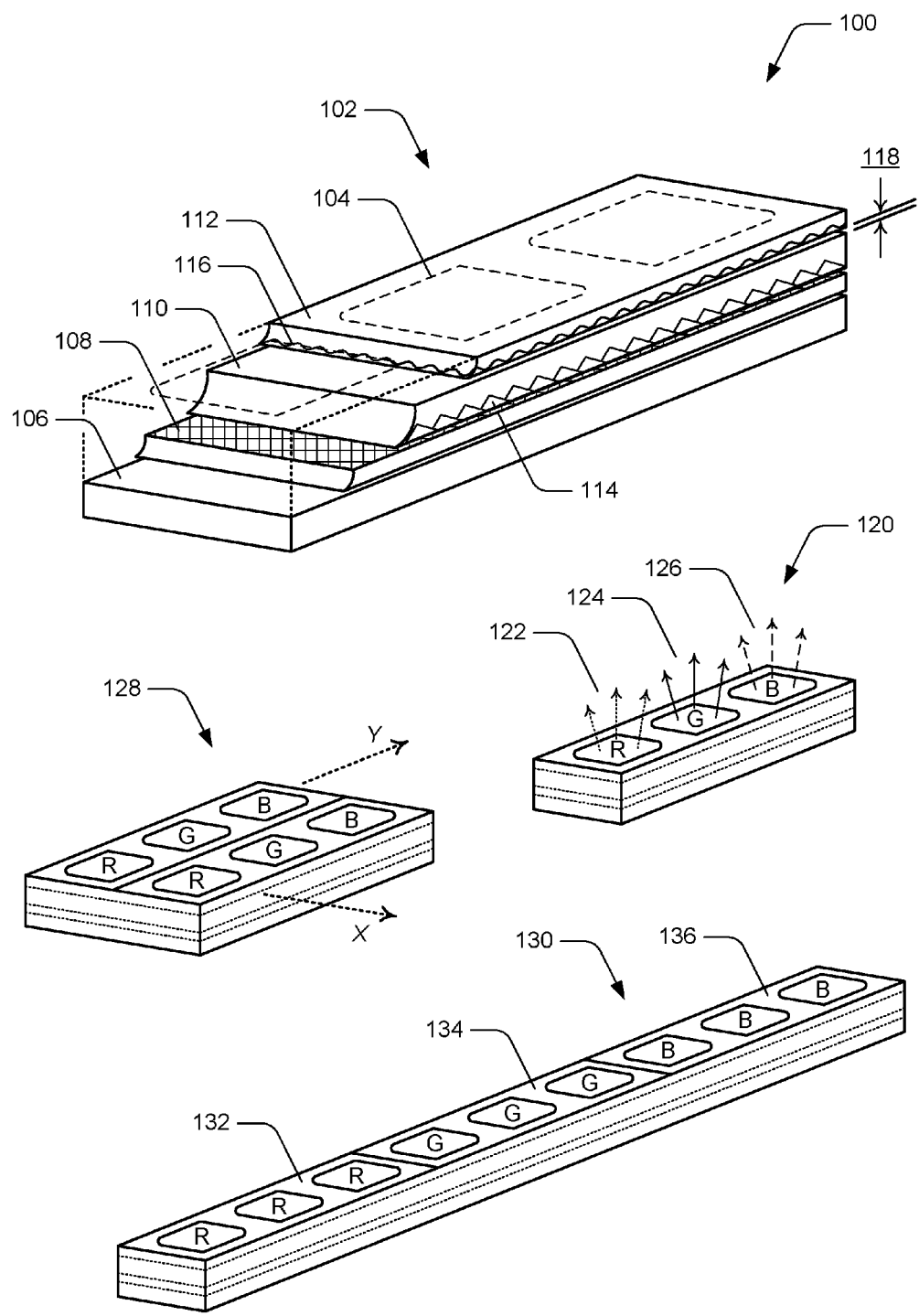
FIG. 1 illustrates examples of imaging structures with embedded light sources in accordance with one or more embodiments.

FIG. 1 illustrates examples 100 of an imaging structure with embedded light sources in accordance with one or more embodiments. An imaging structure 102, similar to a transistor array, has material layers that form the embedded light sources 104 of the imaging structure to directly emit light. For example, inorganic LED (iLED) material can be utilized that produces greater luminescence than typical OLED micro-display solutions which are principally limited to low light scenarios. In this example, the imaging structure 102 is constructed with a silicon backplane layer 106, a driver pad array 108, an emitter material layer 110, and a conductive material layer 112 that may be implemented as a common layer or pixel specific layer that is transparent, a ground plane, a metal layer, a power conductive layer, and/or as another type of material or configuration of materials.

The embedded light sources 104 are formed as individual emitters on the driver pad array in the emitter material layer, and the embedded light sources can be individually controlled at the driver pad array. The emitter material layer 110 can include a reflective structure 114, such as formed in a reflective array that is embedded or etched, for LED pixel isolation and reflective collection of photons (e.g., pseudo parabolic collection) towards an ideal light exit plane. The emitter material layer includes the reflective structure 114 to reflect the light to exit the individual direct emitters. Alternatively or in addition to the reflective structure 114, the imaging structure 102 can include other techniques, such as pyramid and/or cylindrical structures, to improve the optical extraction of the light. Implementations of color conversion may also be applied to the surfaces of the reflective, pyramid, and/or cylindrical structures.

The conductive material layer 112 can be formed with a rough surface 116 that is designed to allow more light emission out from the emitter material layer rather than be reflected or dispersed. Additionally, the material used to form the conductive material layer 112 can be formed around the sides of the individual LED zones. In embodiments, a p-n junction 118 is formed between the emitter material layer 110 and the conductive material layer, where one of the emitter material layer or the conductive material layer is a p-type semiconductor and the other is an n-type semiconductor. The conductive material layer 112 can be implemented as a transparent, common ground plane at the top of the imaging structure for electron flow through the p-n junction 118 as a transparent conductor. Alternatively, two separate layers with an insulation layer can be implemented to allow reflection on a lower layer with no connectivity, and allow reflection on an upper layer with connectivity.

In the imaging structure 102, multiple points between the p-type and the n-type semiconductor materials can be connected (e.g., strapped) for overall efficiency and to improve conductance. The imaging structure is unique for LEDs in that light is not emitted over the whole surface of the imaging structure. For micro-lens efficiency, point source emission can be implemented, and the emitting area can be well under 50% (e.g., such as 10%). Accordingly, the conductive material layer 112 may not be implemented as transparent conductor material, but rather as metal around the emitting area to strap down the p-type material to ground. Alternatively or in addition, TSV-like channels can be utilized to the top of the p-type material for either a pixel driver or for ground. When the structures are implemented as diodes, and depending on which way the p-n junction is layered and how the ground and active are wired, various configurations can be implemented.

In embodiments, the imaging structure 102 can be implemented as inorganic LEDs (iLEDs) on the silicon backplane layer 106 to drive line-scanned or pico-projection devices without using an additional LCOS imager. The imaging structure is also implemented for per-pixel color illumination (rather than full-display) for illumination efficiency and minimal light loss. The imaging structure 102 can be implemented with red, green, and/or blue (RGB) embedded light sources, such as lasers or LEDs, in various one-dimensional (1D), two-dimensional (2D), or n-dimensional arrays, structures, and configurations.

For example, a 1D array imaging structure 120 is formed with red 122, green 124, and blue 126 embedded light sources (e.g., iLEDs or lasers) that are formed with different materials for each different color. In another example, a 2D array imaging structure 128 is formed with two each RGB embedded light sources, and as indicated, may include additional embedded light sources along an X and/or Y axis of the 2D array. In implementations, a 2D array of embedded light sources can include a blue array from blue LED material, a red array from red LED material, and a green array from green LED material. In other embodiments, the imaging structure 102 can be formed as base structure with one material in a single color, such as blue, and then a color conversion layer can be utilized over the imaging structure to convert green and red from the blue base.

The silicon backplane layer 106 of the imaging structure 102 receives serial or parallel data which is used to drive associated pixels, such as for example, at speeds of 30 Hz to 60 Hz, or at faster frame rates. In alternate configurations, the imaging structure 102 may be implemented without the silicon backplane layer 106, in which case the embedded light sources can be initiate passively with data and select lines, such as driver by line driver chips (similar to those used in display devices, for example). In a 1D configuration (e.g., the 1D array imaging structure 120), an image is generated over time by driving a line of pixels an x-number of times per frame. Alternatively, sets of lines can be driven to generate a frame of an image, or entire frames of the image, at one time. Any of the various arrays and configurations can be selected based on intended light levels, timing to scan lines, and illumination efficiency.

Each of the embedded light sources can be individually controlled by the driver pad array 108 (also referred to as the control plane), and can be illuminated in a variety of patterns based on analog, current modulation, pulse-width modulation (PWM), and/or based on specific time and power parameters. The iLED or laser arrays then generate either multiple colors (1D×RGB or 2D×RGB) or single color (UV or blue) with additional color conversion layers, which may include a layer of Quantum Dots (QDs). An additional, optional layer or set of layers can be implemented to leverage LC (liquid crystal) materials to direct, redirect, and/or focus the light that is emitted from the imaging structure array. In embodiments, the embedded light sources are implemented as lasers with a surface emitting laser array or a VCSEL (vertical-cavity surface-emitting laser). An example implementation may include LED material in the center of multiple Bragg reflective layers at one-quarter wavelength apart, and the LEDs create the initial photons that laser in a chamber formed by the Bragg layers.

The driver pad array 108 is implemented for current-based modulation (rather than a voltage-based LCOS) to drive the individual embedded light sources, such as iLEDs or lasers (rather than previously utilized LC material). The driver pad array 108 can have exposed metal pads to directly drive the LED array electrically (e.g., a current-based LED drive) and optically (e.g., an exposed metal pad utilized as a reflector). The connections from the driver pad array 108 to the emitter material layer 110 can be implemented by various techniques, such as TSV (through-silicon via), as deposited material, or layered 1D or 2D iLED structures on top of the control plane (e.g., the driver pad array 108), where the pixels are the rows or grids of the iLEDs. These connections allow control of voltage and/or current for controlling light illumination from the imaging structure array.

An example imaging structure 130 can be implemented as a fault tolerant array used to avoid yield loss of illumination when single pixel zones fail. The imaging structure 130 is formed as an array of nine embedded light sources (e.g., iLEDs) in three sections, with three red 132, three green 134, and three blue 136 embedded light sources. After production, a test can be used to determine weak or faulty light source sectors, which can then be marked for non-use in a final LED scan controller. Additionally, if one embedded light source of a section fails, the illumination intensity of the other two embedded light sources in the section can be increased, such as with gamma correction for non-linear illumination, to calibrate for the failed light source.

Other imaging structure configurations can also be utilized as a fault tolerant array, such as with two pixels per sub-pixel (e.g., an array of six embedded light sources with two red, two green, and two blue embedded light sources), or an array of embedded light sources with more than three pixels per color. Other imaging structure configurations can be implemented with multiple sets of LED arrays that are positioned, or otherwise fit, extremely close to one another to avoid having multiple LEDs per pixel. Any number of configuration patterns are also possible, such as a 2D array, four square blocks, a 2×4 configuration, or any other n×m configuration that allows for smaller array yields.

Figure 2:
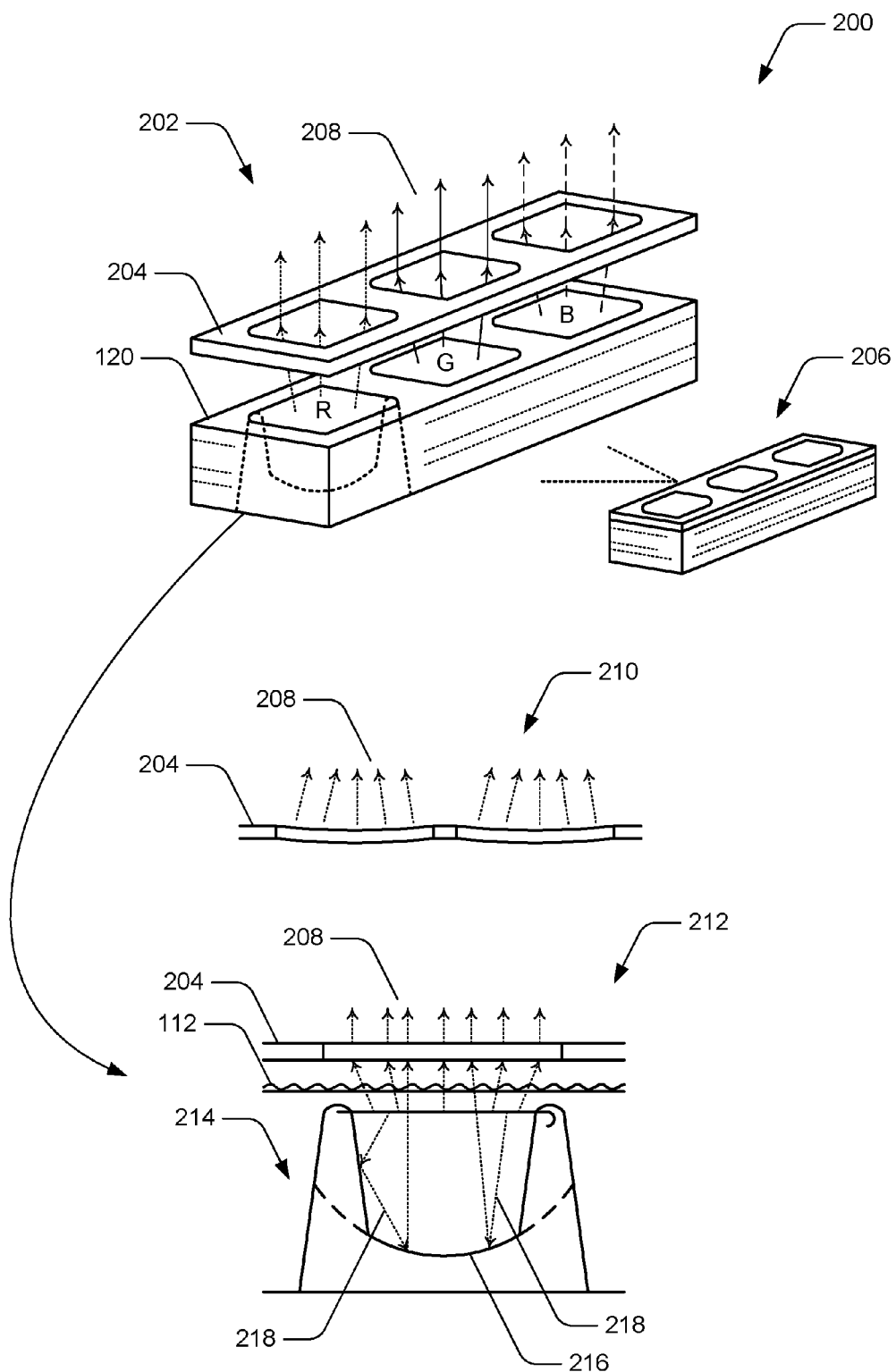
FIG. 2 illustrates examples of the imaging structures implemented with a micro lens optic in accordance with one or more embodiments.

FIG. 2 illustrates examples 200 of the imaging structures described with reference to FIG. 1, and implemented with a micro lens optic that collects and redirects the light emitted from the embedded light sources. In an example 202, the imaging structure 120, which is an example of the imaging structure 102, has micro lens optics 204 positioned over the embedded light sources, such as shown at 206. For example, the micro lens optics are positioned above the LED emitters and/or the conductive material layer 112 to reduce light loss. Optionally, a DBEF (dual brightness enhancement film) material can be utilized between the imaging structure and the micro lens optics to extract polarized light. The light 208 that is emitted from the RGB light sources (e.g., iLEDs or lasers) is reflected through the micro lens optics and can then be directed in an imaging system, such as reflected off of a MEMS mirror and then directed into a waveguide or otherwise projected. In embodiments, the micro lens optics 204 may be formed as parabolic optics as shown at 210 for more efficient redirection (e.g., focus or concentration) of the light 208 that is emitted from the embedded light sources.

In embodiments, the walls of the LED emitters that are formed as the embedded light sources in an imaging structure, such as the imaging structure 120, can be formed to approximate parabolic reflection in the emitter material layer 110 to direct reflected light from within the emitter material. For example, as shown at 212, an individual LED 214 can be formed in the emitter material layer with the walls of the LED emitter designed to approximate a parabolic structure 216 to direct as much of the reflected light 218 as possible back to the micro lens optic 204. Alternatively, the parabolic reflector material may be formed at the top of the LED material (e.g., the emitter material layer 110) if the p-n junction is also in the top section of the LED material. Any method allowing implantation of a reflective and/or conductive material below the p-n junction would have far higher efficiencies. The pseudo parabolic collectors can be formed using the driver metal as a bottom, etched, pressed, or other techniques with metal or other reflective material in the side walls of the LED material. These structures are formed deeper than the p-n material junction, but do not have to run completely through the LED material.

Figure 3:
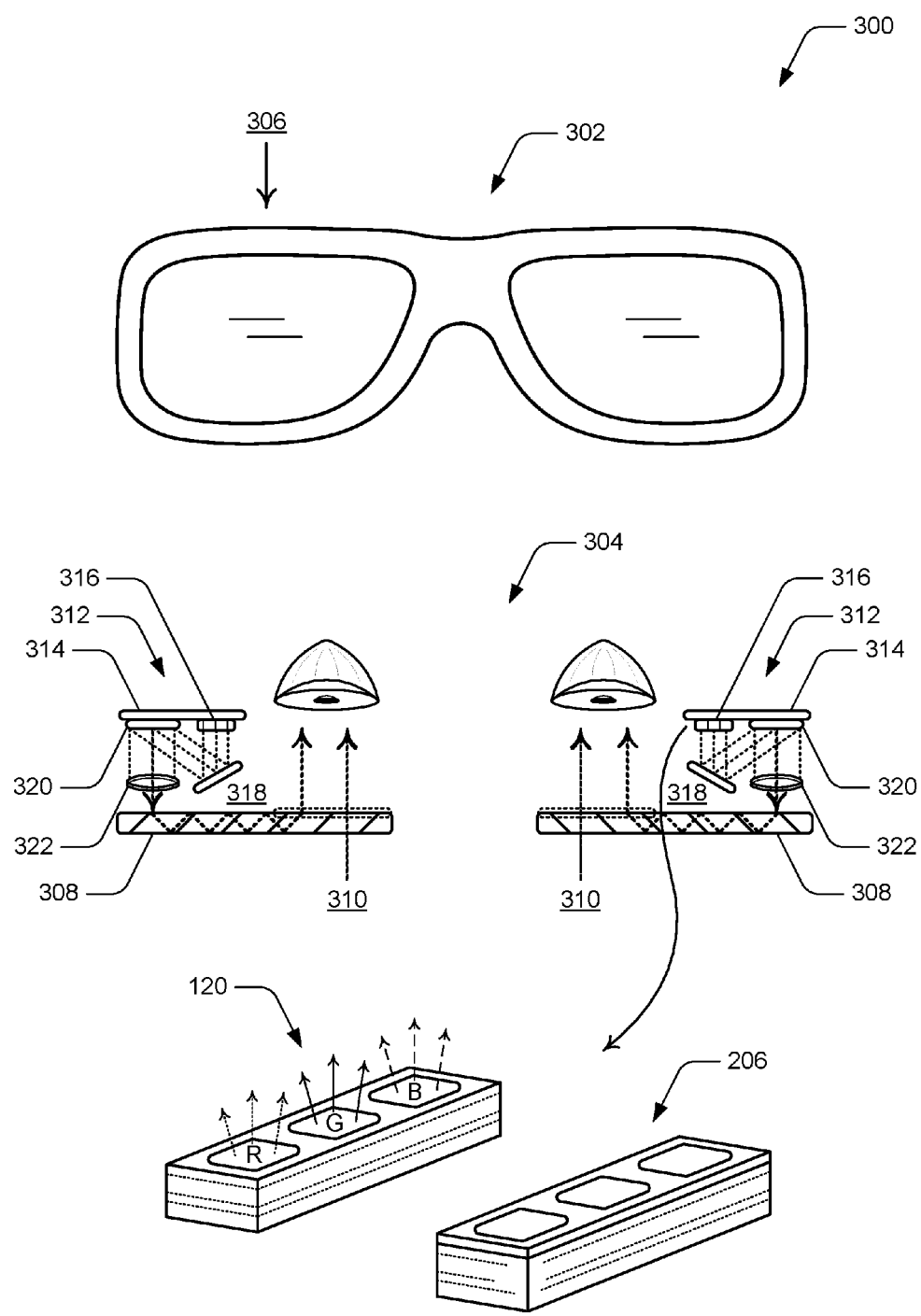
FIG. 3 illustrates an example system in which embodiments of an imaging structure with embedded light sources can be implemented.

FIG. 3 illustrates an example system 300 in which various embodiments of an imaging structure with embedded light sources can be implemented. An example wearable display device 302 includes left and right display lens systems, such as display lens systems 304 that are viewed from a perspective 306 of the wearable display device, as if viewing the display lens systems from the top of the device. In embodiments, the display lens systems 304 can be implemented as left and right display lens systems of the wearable display device described with reference to FIG. 4. A wearable display device can be implemented as any type of glasses or head-mounted display (HMD) that includes implementations of the display lens systems 304 (e.g., left and right display lens systems) through which a user can view the surrounding environment, yet also see virtual images that are generated for display and appear as a part of the environment. References to a left imaging system and a right imaging system, as described herein, correlate to a user's left and right eyes (e.g., from the perspective of wearing and looking through the wearable display device). Alternatively, the left and right imaging systems may be described from the perspective of looking at the wearable display device.

The display lens systems 304 include a display optic 308, such as a see-through and reflecting waveguide, through which light 310 of an image (e.g., an image of the environment as viewed through the wearable display device) is projected for viewing. In this example, the display lens systems 304 also include an imaging unit 312, which can be implemented with any number of micro display panels, imaging structures with direct emitters, lenses, and reflecting elements to display and project a virtual image into a see-through and reflecting waveguide. The see-through, reflecting waveguide (i.e., the display optic 308) is implemented for internal reflection and conducts visible light of a virtual image that is generated by the imaging unit 312 for viewing by a user, and also passes through the light 310 from the surrounding environment for viewing by the user. A display lens system 304 with an imaging unit can also be implemented with components of the display lens system described with reference to FIG. 4 to implement embodiments of an imaging structure with embedded light sources.

In embodiments, the imaging units 312 of the display lens systems 304 each include a printed circuit board 314 that incorporates an embodiment of an imaging structure 316. The imaging structures 316 can be implemented as any of the example imaging structures described with reference to FIGS. 1-3, such as the imaging structure 120 with RGB embedded light sources or the imaging structure 120 with the micro lens optics 204 positioned over the embedded light sources, such as shown at 206.

An imaging structure 316 includes the embedded light sources that emit light, which is reflected by a reflecting mirror 318 onto a MEMS scanning mirror 320 that is also incorporated with the printed circuit board 314. The imaged light is then directed by the scanning mirror through an imaging optic 322 that directs the light into the see-through, reflecting waveguide (i.e., the display optic 308). The MEMS scanning mirror (e.g., or other electrically alterable mirror), or an LC steering solution, can be implemented with line scanning techniques or full X,Y LED array light source configurations, which can be used to avoid long and/or narrow arrays of LED material, allow larger resolutions, and can be used with eye-tracking projection solutions.

Figure 4:
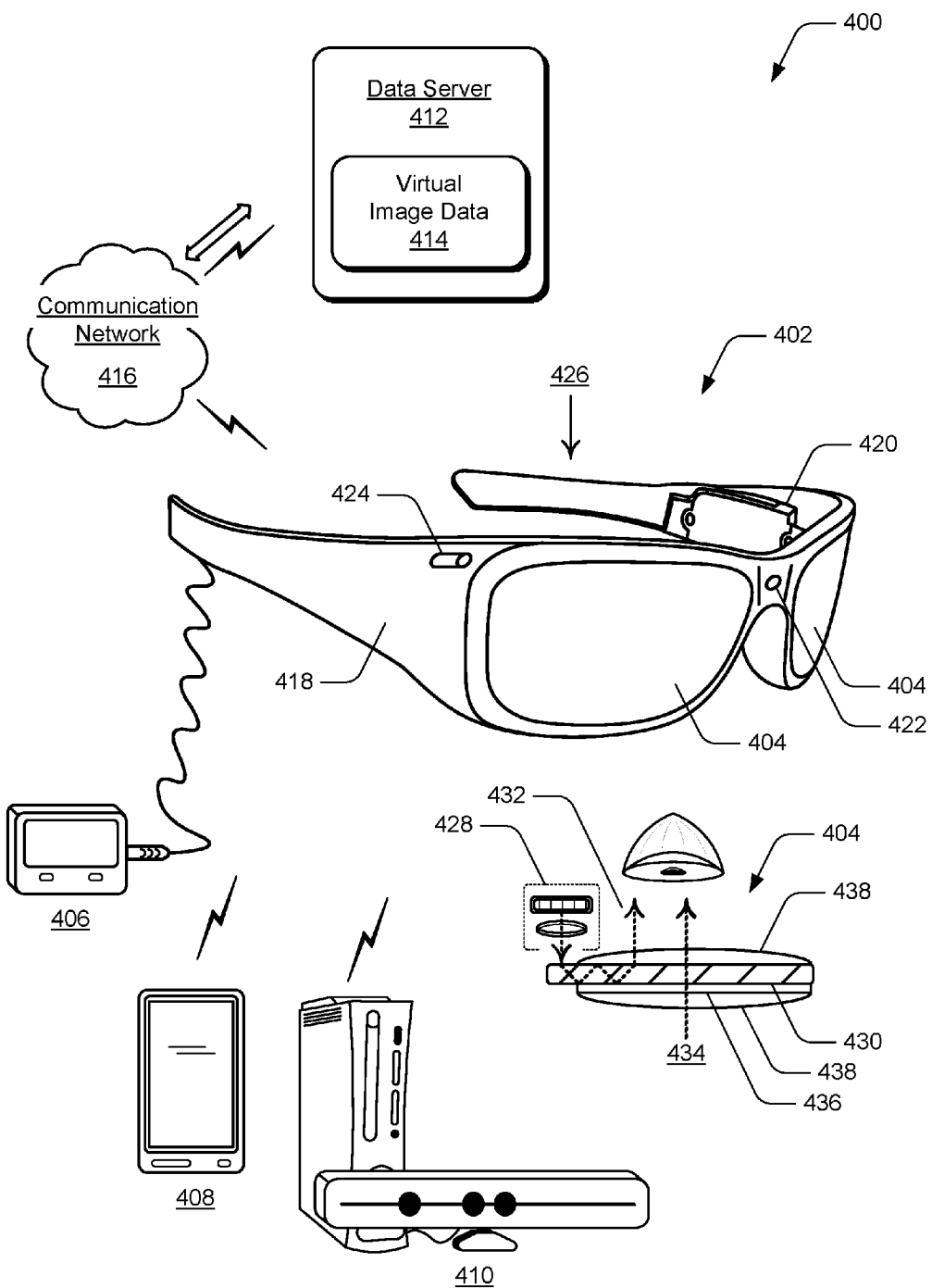
FIG. 4 illustrates an example system that includes an example of a wearable display device in which embodiments of an imaging structure with embedded light sources can be implemented.

FIG. 4 illustrates an example system 400 that includes an example wearable display device 402 in which embodiments of an imaging structure with embedded light sources can be implemented. The wearable display device can be implemented as any type of glasses or head-mounted display (HMD) that includes display lens systems 404 (e.g., left and right display lens systems) through which a user can view the surrounding environment, yet also see virtual images (e.g., any type of object, video, text, graphic, and the like) that are generated for display and appear as a part of the environment.

The wearable display device 402 can be implemented as an independent, portable system that includes memory, software, a processor, and/or a power source. Alternatively or in addition, the wearable display device may be communicatively linked to a controller 406 that includes any one or combination of the memory, software, processor, and/or power source, such as a battery unit. The controller can be implemented for wired or wireless communication with the wearable display device. The controller and/or the wearable display device can also be implemented with any number and combination of differing components as further described with reference to the example device shown in FIG. 6. For example, the controller and/or the wearable display device includes an imaging application implemented as computer-executable instructions, such as a software application, and executed by a processor to implement embodiments of an imaging structure with embedded light sources as described herein.

In embodiments, the controller may be implemented as a dedicated device (e.g., the wired controller 406), as a mobile phone 408, a tablet or other portable computer device, a gaming system 410, or as any other type of electronic device that can be implemented to process and generate virtual images for display as part of the environment that is viewed through the display lens system of the wearable display device. The controller may communicate with the wearable display device wirelessly via WiFi™, Bluetooth™, infrared (IR), RFID transmission, wireless Universal Serial Bus (WUSB), cellular, or via other wireless communication techniques.

The example system 400 also includes a data server 412, or data service, that communicates, or otherwise distributes, virtual image data 414 to the wearable display device 402 via a communication network 416. For example, the data server may be part of a network-based gaming system that generates virtual images for augmented reality display at the wearable display device. Alternatively, the data server may be part of a navigation system that communicates navigation directions and information for display in the display lens systems 404 of the wearable display device. In another example, the data server may be part of a messaging service, such as an e-mail or text messaging system, that communicates e-mail and/or text messages to the wearable display device for display in the display lens systems, where a user can read a message as an augmented reality image that is displayed over the environment viewed through the wearable display device.

Any of the devices, servers, and/or services can communicate via the communication network 416, which may be implemented to include wired and/or wireless networks. The communication network can also be implemented using any type of network topology and/or communication protocol, and can be represented or otherwise implemented as a combination of two or more networks, to include IP-based networks and/or the Internet. The communication network may also include mobile operator networks that are managed by mobile operators, such as a communication service provider, cell-phone provider, and/or Internet service provider.

The wearable display device 402 includes a frame 418, such as in the form of glasses, goggles, or any other structure, that supports and incorporates the various components of the device, as well as serves as a conduit for electrical and other component connections. A components module 420 (or components modules on the left, right, and/or both sides of the device frame) incorporates any of the various components, such as processing and control circuitry, memory, software, a processor, GPS transceiver, and/or power source. The wearable display device may also include a microphone 422 to record audio data from the surrounding environment, as well as ear phones for audio feedback as part of an augmented reality experience.

The wearable display device 402 also includes various cameras 424 that capture video and still images of the surrounding environment. The image and video data can be processed on the device and/or by a controller device (e.g., controller 406), and used to create a mapping field to orient and track a user in the environment space. The wearable display device can also include eye tracking cameras used to determine a user's eyeball location and track eye movements. The wearable display device may also include a temperature sensor, as well as inertial sensors and/or attitude sensors, including MEMS gyros, magnetic sensors (e.g., a compass), and acceleration sensors for sensing position, orientation, and acceleration of the wearable display device.

An example of one display lens system 404 is shown from a viewer perspective 426 of the wearable display device 402, as if viewing the display lens system from the top of the device. The display lens system includes an imaging system 428, which can be implemented with any number of micro display panels, lenses, and reflecting elements to display and project a virtual image into a see-through and reflecting waveguide 430. A display lens system 404 can also be implemented as the imaging units described with reference to FIG. 3 to implement embodiments of an imaging structure with embedded light sources. The see-through, reflecting waveguide 430 is implemented for internal reflection and conducts the visible light 432 of a virtual image that is generated by the imaging unit for viewing by a user, and also passes through the light 434 from the surrounding environment for viewing by the user.

The micro display panels, lenses, and/or reflecting elements of the imaging system 428 can be implemented with various display technologies, such as implemented with a transparent LCD, or using a transmissive projection technology where the light source is modulated by optically active material, backlit with white light. These technologies can be implemented using LCD type displays with powerful backlights and high optical energy densities. Alternatively, a micro display and/or reflecting element can be implemented using a reflective technology, such as digital light processing (DLP) and liquid crystal on silicon (LCOS), that reflects external light, which is reflected and modulated by an optical material.

In embodiments, the imaging system 428 (or other components of a display lens system 404) can be implemented to include an infra-red (IR) laser utilized for system calibrations and/or as an illumination source for an eye-tracking system and camera that tracks the position of a user's eyes. The eye-tracking system includes the eye-tracking illumination source, which is not a visible light, and includes an eye-tracking IR sensor. In implementations that include color conversion, the illumination source can be implemented as UV or blue iLED arrays that emit the IR light, which may be emitted from one or more of the pixels. The IR sensor can be implemented as an IR camera that provides infrared image data of the eye for eye-tracking processing, or an IR sensor that detects eye reflections when the eye is illuminated. Alternatively or in addition, sensors can be implemented in the CMOS driver array to detect the feedback. In implementations, the light reflections (e.g., the IR return) may be directed with SBG or SRB methods. The see-through and reflecting waveguide 430 can also be utilized for the infrared illumination, and for eyeball reflections that the eye-tracking system uses to track the position of the user's eyes.

In this example, the display lens systems 404 include an optional opacity filter 436, and a see-through lens 438 on each side of the waveguide 430. The see-through lenses can be standard eye-glass lenses and made to prescription (or no prescription). The opacity filter selectively blocks natural light, either uniformly or on a per-pixel basis, from passing through the see-through and reflecting waveguide to enhance the contrast of a displayed virtual image.

Example method 500 is described with reference to FIG. 5 in accordance with one or more embodiments of an imaging structure with embedded light sources. Generally, any of the services, functions, methods, procedures, components, and modules described herein can be implemented using software, firmware, hardware (e.g., fixed logic circuitry), manual processing, or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

Figure 5:
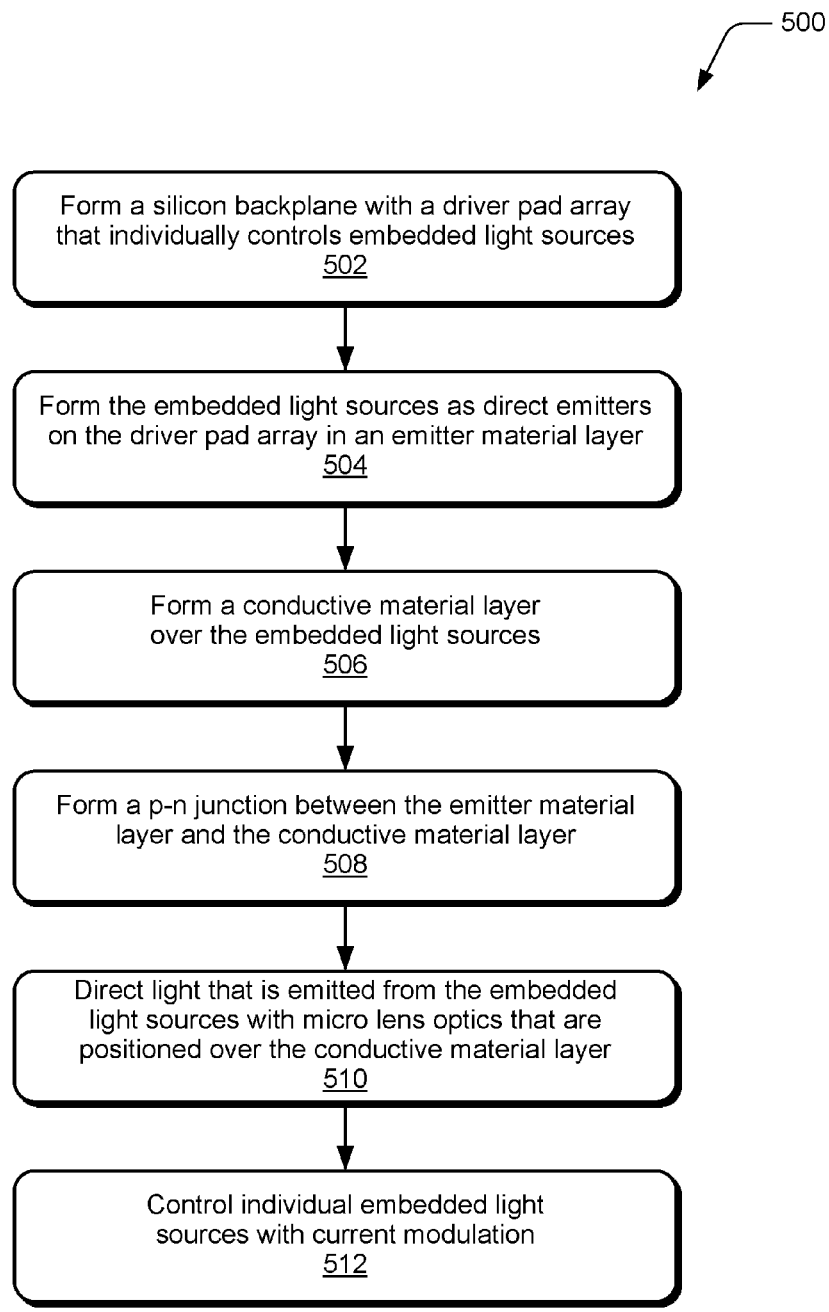
FIG. 5 illustrates example method(s) of an imaging structure with embedded light sources in accordance with one or more embodiments.

FIG. 5 illustrates example method(s) 500 of an imaging structure with embedded light sources. The order in which the method blocks are described are not intended to be construed as a limitation, and any number of the described method blocks can be combined in any order to implement a method, or an alternate method.

At block 502, a silicon backplane is formed with a driver pad array that individually controls embedded light sources. For example, the imaging structure 102 (FIG. 1) is formed with the silicon backplane layer 106 and the driver pad array 108, via which the embedded light sources can be individually controlled.

At block 504, the embedded light sources are formed as direct emitters on the driver pad array in an emitter material layer. For example, the imaging structure 102 includes the emitter material layer 110 (e.g., inorganic material) in which the embedded light sources are formed as lasers or LEDs for direct light emission. The embedded light sources can be formed as individual emitters in the emitter material layer to approximate parabolic reflection that directs reflected light from within an individual direct emitter. The emitter material layer can also include the reflective structure 114 that reflects the light to exit the embedded light sources. In embodiments, the embedded light sources include red, green, and blue (RGB) direct emitters that form the imaging structure as one a one-dimensional or two-dimensional array of the embedded light sources.

At block 506, a conductive material layer is formed over the embedded light sources and, at block 508, a p-n junction is formed between the emitter material layer and the conductive material layer. For example, the imaging structure 102 includes the conductive material layer 112 and the p-n junction 118 is formed between the emitter material layer 110 and the conductive material layer, where one of the emitter material layer or the conductive material layer is a p-type semiconductor and the other is an n-type semiconductor.

At block 510, the light that is emitted from the embedded light sources is directed with micro lens optics that are positioned over the conductive material layer. For example, an imaging structure, such as the imaging structure 120, includes the micro lens optics 204 (FIG. 2) that directs the light that is emitted from the embedded light sources. In an embodiment, the micro lens optics are parabolic optics as shown at 210 that concentrates the light that is emitted from the embedded light sources. At block 412, individual embedded light sources are controlled with current modulation. For example, an imaging application 620 (FIG. 6) initiates current-modulation control of the embedded light sources via the driver pad array 108.

Figure 6:
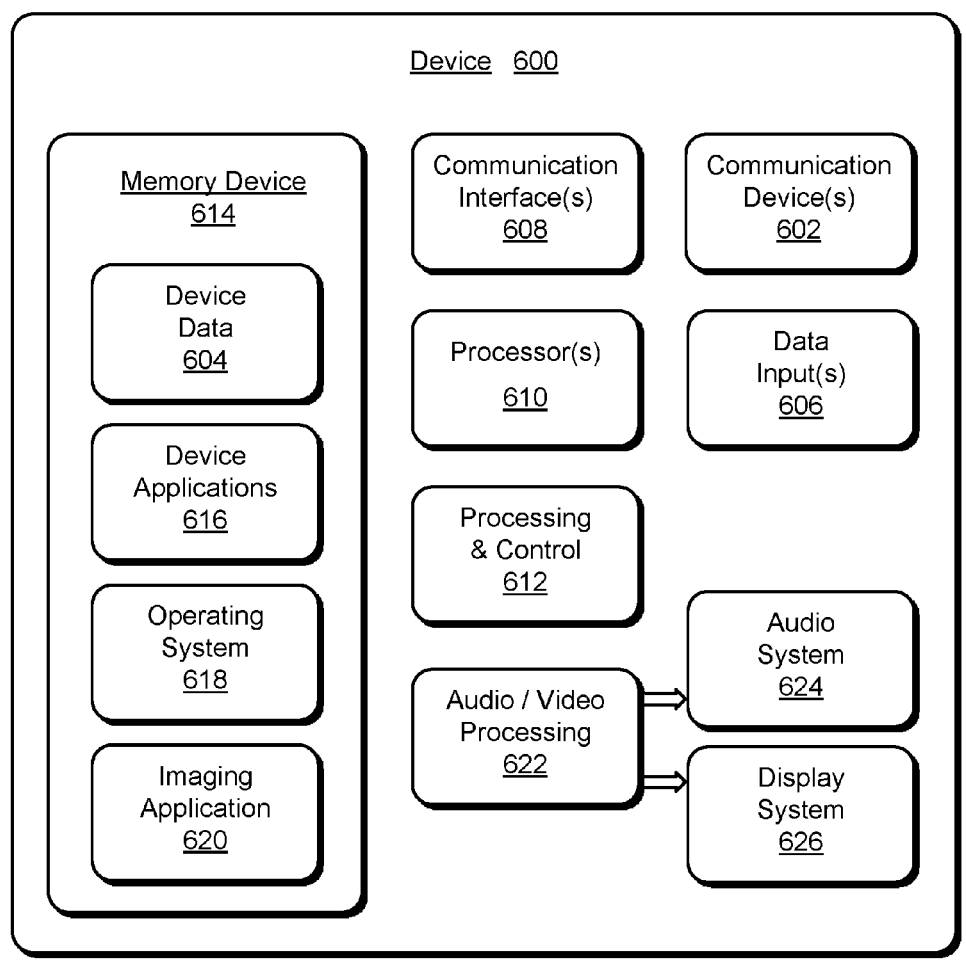
FIG. 6 illustrates various components of an example device that can implement embodiments of an imaging structure with embedded light sources.

FIG. 6 illustrates various components of an example device 600 that can be implemented as any of the devices described with reference to the previous FIGS. 1-5, such as a wearable display device and/or a controller for a wearable display device. In embodiments, the device may be implemented as any one or combination of a fixed or mobile device, in any form of a consumer, computer, portable, communication, phone, navigation, appliance, gaming, media playback, and/or electronic device. The device may also be associated with a user (i.e., a person) and/or an entity that operates the device such that a device describes logical devices that include users, software, firmware, hardware, and/or a combination of devices.

The device 600 includes communication devices 602 that enable wired and/or wireless communication of device data 604, such as virtual image data, as well as video and images data, and other media content stored on the device. The media content stored on the device can include any type of audio, video, and/or image data. The device includes one or more data inputs 606 via which any type of data, media content, and/or inputs can be received, such as user-selectable inputs and any other type of audio, video, and/or image data received from any content and/or data source.

The device 600 also includes communication interfaces 608, such as any one or more of a serial, parallel, network, or wireless interface. The communication interfaces provide a connection and/or communication links between the device and a communication network by which other electronic, computing, and communication devices communicate data with the device.

The device 600 includes one or more processors 610 (e.g., any of microprocessors, controllers, and the like) or a processor and memory system (e.g., implemented in an SoC), which process computer-executable instructions to control the operation of the device. Alternatively or in addition, the device can be implemented with any one or combination of software, hardware, firmware, or fixed logic circuitry that is implemented in connection with processing and control circuits which are generally identified at 612. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 600 also includes one or more memory devices 614 (e.g., computer-readable storage media) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device. Computer-readable storage media can be any available medium or media that is accessed by a computing device.

A memory device 614 provides data storage mechanisms to store the device data 604, other types of information and/or data, and device applications 616. For example, an operating system 618 can be maintained as a software application with the memory device and executed on the processors. The device applications may also include a device manager or controller, such as any form of a control application, software application, signal processing and control module, code that is native to a particular device, a hardware abstraction layer for a particular device, and so on. In this example, the device applications also include an imaging application 620 that may implement embodiments of an imaging structure with embedded light sources as described herein.

The device 600 may also include an audio and/or video processing system 622 that generates audio data for an audio system 624 and/or generates display data for a display system 626. In implementations, the audio system and/or the display system are external components to the device. Alternatively, the audio system and/or the display system are integrated components of the example device.

Although embodiments of an imaging structure with embedded light sources have been described in language specific to features and/or methods, the appended claims are not necessarily limited to the specific features or methods described. Rather, the specific features and methods are disclosed as example implementations of an imaging structure with embedded light sources.

The invention claimed is:

1. An imaging structure, comprising:
a silicon backplane with a driver pad array;
embedded light sources formed on the driver pad array in an emitter material layer having a same length and width as the silicon backplane with the driver pad array; and
a conductive material layer over the embedded light sources forms a p-n junction between the emitter material layer and the conductive material layer, the conductive material layer having the same length and width as the silicon backplane with the driver pad array and the emitter material layer.

2. An imaging structure as recited in claim 1, wherein the embedded light sources are configured for individual control at the driver pad array to generate and emit light.

3. An imaging structure as recited in claim 1, wherein the embedded light sources are formed in inorganic material as one of lasers or LEDs for direct light emission.

4. An imaging structure as recited in claim 3, wherein the LEDs are individual emitters formed in the emitter material layer and the LEDs approximate parabolic reflection that directs reflected light from within the inorganic material.

5. An imaging structure as recited in claim 1, wherein the embedded light sources are individual emitters formed in the emitter material layer and configured for individual current-based control.

6. An imaging structure as recited in claim 5, wherein the conductive material layer is formed around the individual emitters.

7. An imaging structure as recited in claim 1, wherein the embedded light sources are emitter cells formed in the emitter material layer, and wherein the emitter material layer includes a reflective structure configured to reflect the light to exit the emitter cells.

8. An imaging structure as recited in claim 1, wherein the embedded light sources comprise red, green, and blue (RGB) direct emitters that form the imaging structure as one of a one-dimensional array or a two-dimensional array of the embedded light sources.

9. An imaging structure as recited in claim 1, wherein the imaging structure is a fault-tolerant array of sections of the embedded light sources, and wherein a section of the fault-tolerant array includes redundant embedded light sources configured for increased illumination in an event that one of the redundant embedded light sources fails.

10. An imaging structure as recited in claim 1, further comprising micro lens optics positioned over the conductive material layer and configured to direct the light that is emitted from the embedded light sources.

11. An imaging structure as recited in claim 10, wherein the micro lens optics are formed as parabolic optics configured to concentrate the light that is emitted from the embedded light sources.

12. A method, comprising:
    forming a silicon backplane with a driver pad array that individually controls embedded light sources;
    forming the embedded light sources as direct emitters on the driver pad array in an emitter material layer having a same length and width as the silicon backplane with the driver pad array; and
    forming a conductive material layer over the embedded light sources, the conductive material layer having the same length and width as the silicon backplane with the driver pad array and the emitter material layer.

13. A method as recited in claim 12, wherein the embedded light sources are formed as individual emitters in the emitter material layer to approximate parabolic reflection that directs reflected light from within an individual emitter, and the method further comprising directing light emitted from the embedded light sources with micro lens optics that are positioned over the conductive material layer.

14. A method as recited in claim 13, wherein the micro lens optics are parabolic optics that concentrate the light that is emitted from the embedded light sources.

15. A method as recited in claim 12, further comprising controlling individual embedded light sources with current modulation.

16. A method as recited in claim 12, further comprising forming a p-n junction between the emitter material layer and the conductive material layer.

17. A method as recited in claim 12, wherein the embedded light sources are formed in inorganic material as one of lasers or LEDs for direct light emission.

18. A method as recited in claim 12, wherein the emitter material layer includes a reflective structure that reflects the light to exit the embedded light sources.

19. A method as recited in claim 12, wherein the embedded light sources comprise red, green, and blue (RGB) direct emitters that form an imaging structure as one of a one-dimensional array or a two-dimensional array of the embedded light sources.

20. A wearable display device, comprising:
    left and right imaging units of display lens systems configured to generate an augmented reality image, each of the left and right imaging units including an imaging structure that comprises:
    a silicon backplane with a driver pad array configured to individually control embedded light sources that are formed as direct emitters on the driver pad array in sections of an emitter material layer; and
    a conductive material layer over the embedded light sources, the conductive material layer forming a p-n junction between the emitter material layer and the conductive material layer, the conductive material layer having a same length and width as the silicon backplane, the driver pad array, and the emitter material layer.

* * * * *